(12) United States Patent
Saito

(10) Patent No.: US 7,221,030 B2
(45) Date of Patent: May 22, 2007

(54) SEMICONDUCTOR DEVICE

(75) Inventor: Hitoshi Saito, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/047,603

(22) Filed: Feb. 2, 2005

(65) Prior Publication Data

US 2005/0127456 A1   Jun. 16, 2005

Related U.S. Application Data

(62) Division of application No. 10/647,427, filed on Aug. 26, 2003, now Pat. No. 6,869,859.

(30) Foreign Application Priority Data

Aug. 30, 2002 (JP) .............................. 2002-255471

(51) Int. Cl.
*H01L 29/94* (2006.01)
(52) U.S. Cl. ...................... 257/374; 257/296; 257/397; 257/466; 257/510; 257/513; 257/501
(58) Field of Classification Search ................ 257/374, 257/397, 466, 510, 513
See application file for complete search history.

(56) References Cited

U.S. PATENT DOCUMENTS

| | | | |
|---|---|---|---|
| 5,858,830 A | 1/1999 | Yoo et al. | 438/241 |
| 6,281,050 B1 | 8/2001 | Sakagami | |
| 6,403,446 B1 | 6/2002 | Ishitsuka et al. | 438/424 |
| 6,444,554 B1 * | 9/2002 | Adachi et al. | 438/587 |
| 6,518,146 B1 * | 2/2003 | Singh et al. | 438/427 |
| 6,580,117 B2 | 6/2003 | Shimizu | 257/315 |
| 6,821,854 B2 * | 11/2004 | Kanda et al. | 438/275 |
| 2004/0119135 A1 | 6/2004 | Van Bentum | 257/510 |

FOREIGN PATENT DOCUMENTS

| | | |
|---|---|---|
| CN | 1231064 A | 10/1999 |
| JP | 02-260660 | 10/1990 |
| JP | 2000-269450 | 9/2000 |
| JP | 2001-068652 | 3/2001 |
| WO | WO 98/12742 | 3/1998 |

OTHER PUBLICATIONS

Japanese Office Action dated Oct. 10, 2006 (mailing date), issued in corresponding Japanese Patent Application No. 2002-255471.

* cited by examiner

*Primary Examiner*—Leonardo Andujar
*Assistant Examiner*—Tan Tran
(74) *Attorney, Agent, or Firm*—Westerman, Hattori, Daniels & Adrian, LLP.

(57) ABSTRACT

A pad oxide film and a silicon nitride film are formed on a semiconductor substrate. Next, after the patterning of the silicon nitride film, by etching the pad oxide film and the substrate, a first trench is formed in a first region and a second trench is formed in a second region. After that, by performing side etching of the pad oxide film of the first region while protecting the second region with a resist, a gap is formed between the substrate and the silicon nitride film. Subsequently, the inner surfaces of the first and second trenches are oxidized. At this time, a relatively large volume of oxidizing agent (oxygen) is supplied to a top edge portion of the first trench, and the curvature of the corner of the substrate increases.

2 Claims, 34 Drawing Sheets

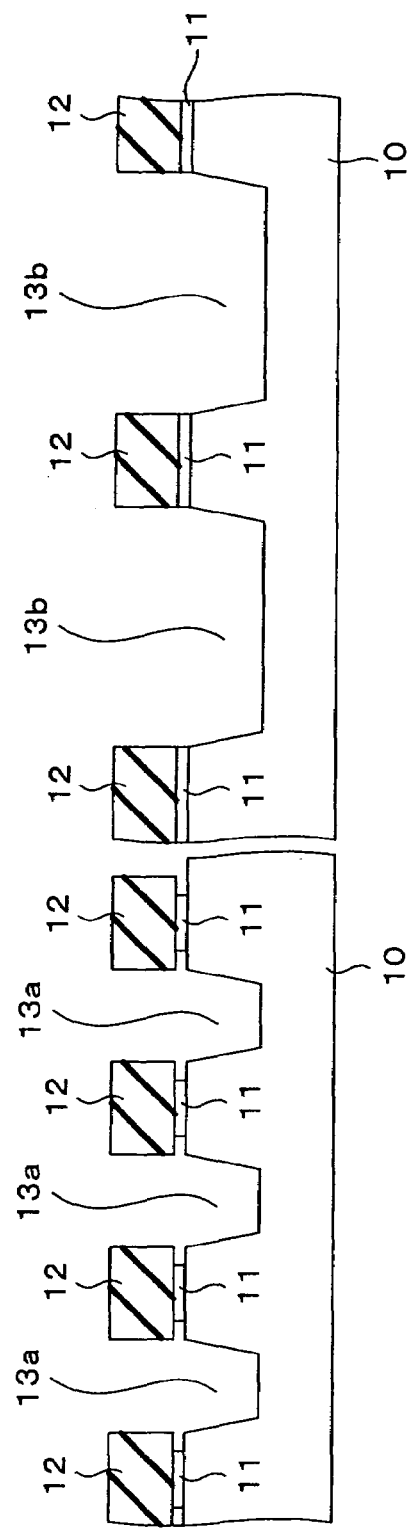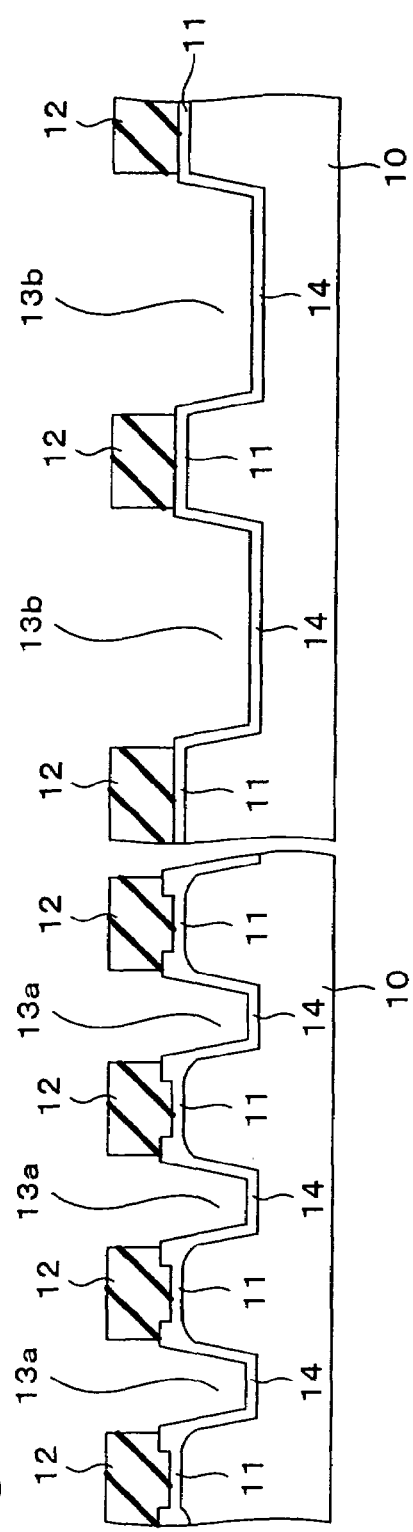

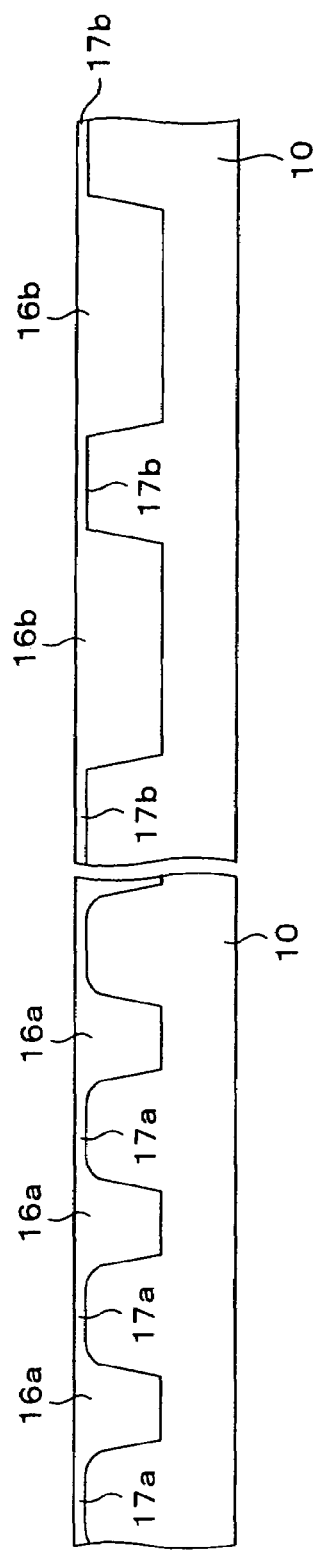
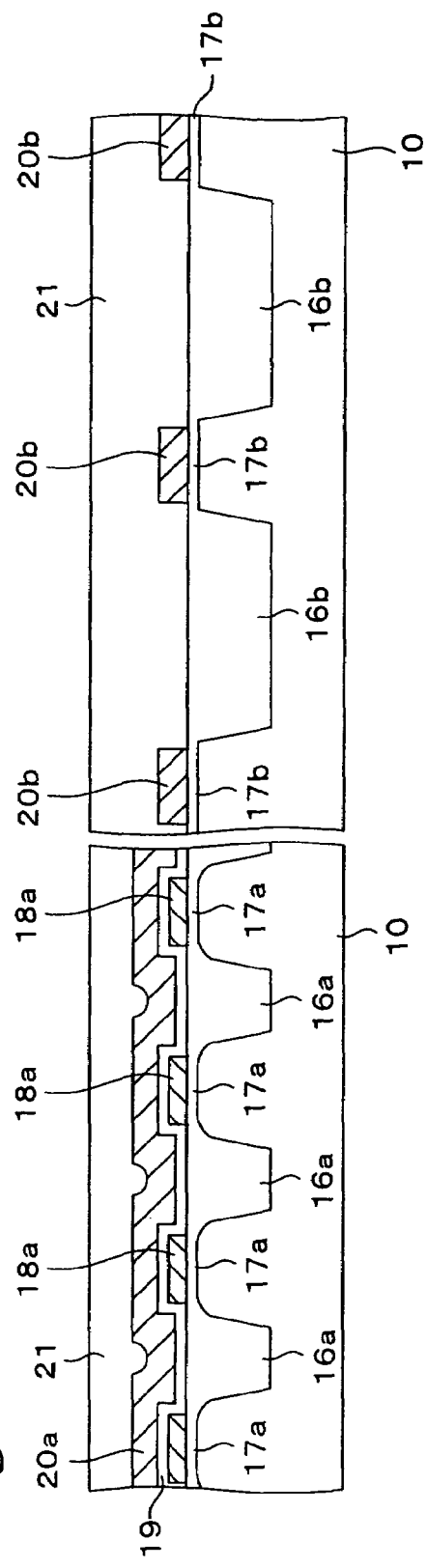
Fig. 3G
Fig. 3H

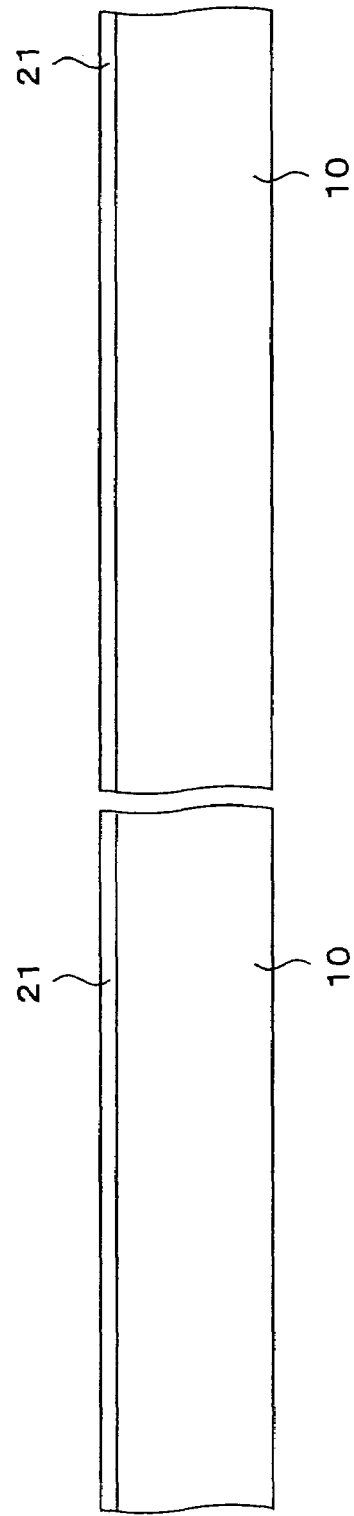
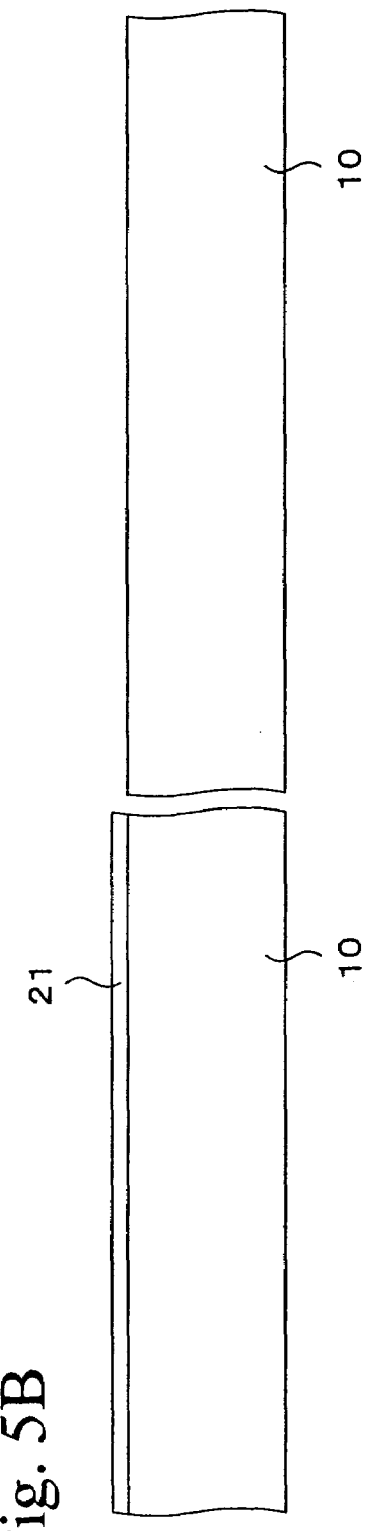

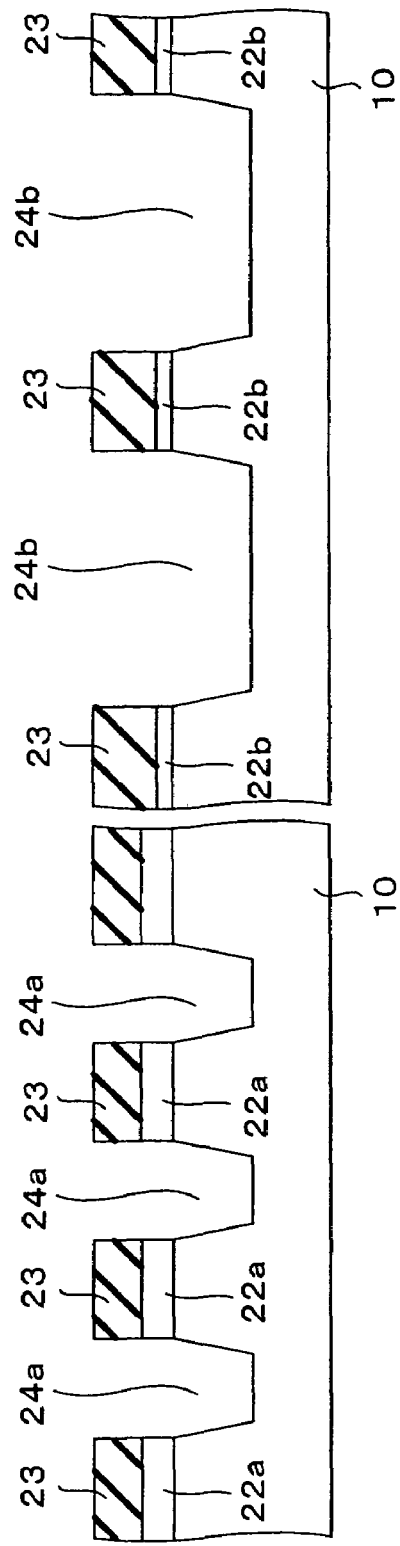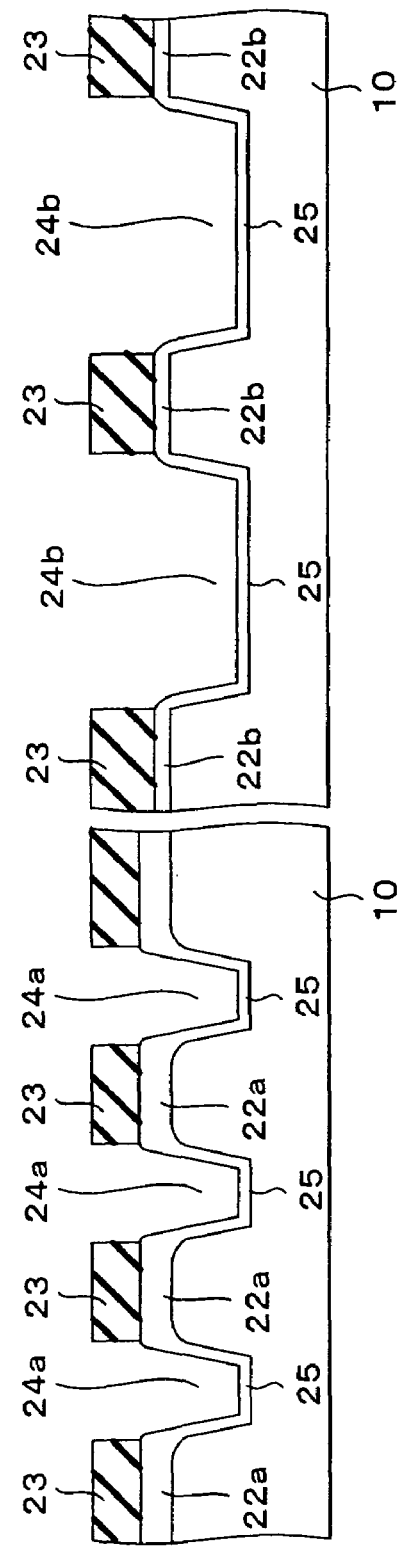

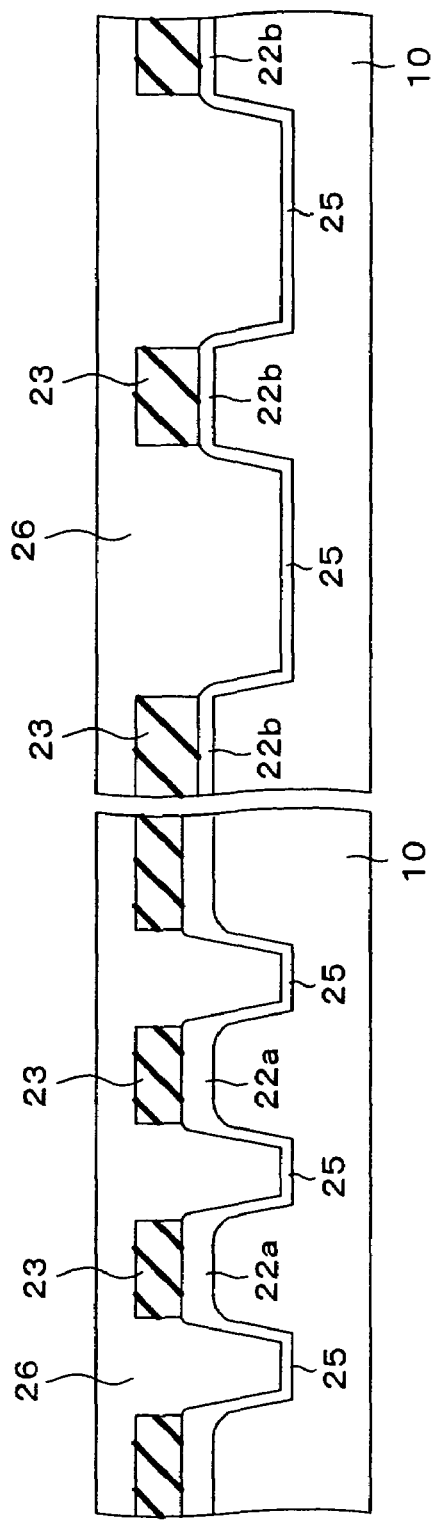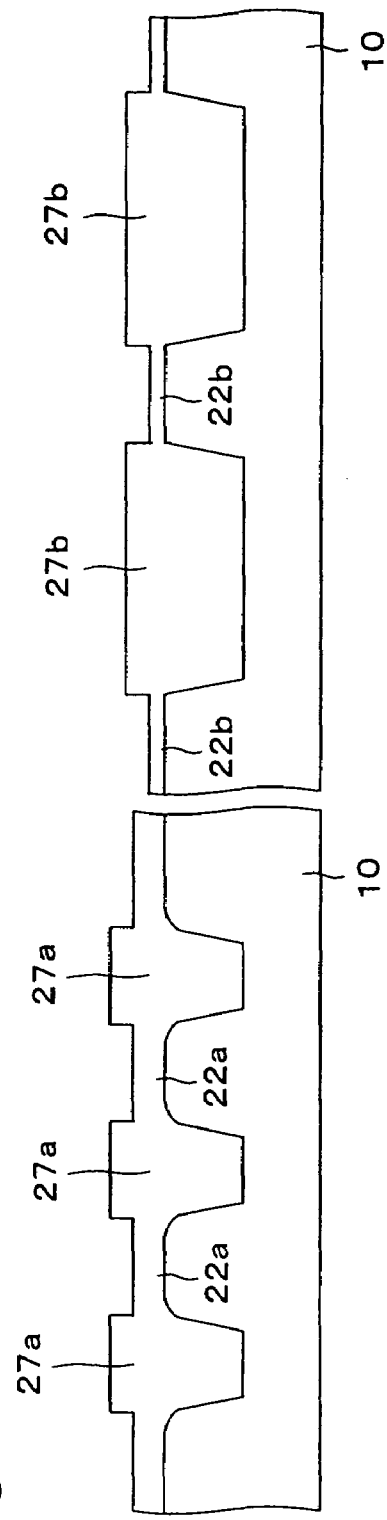

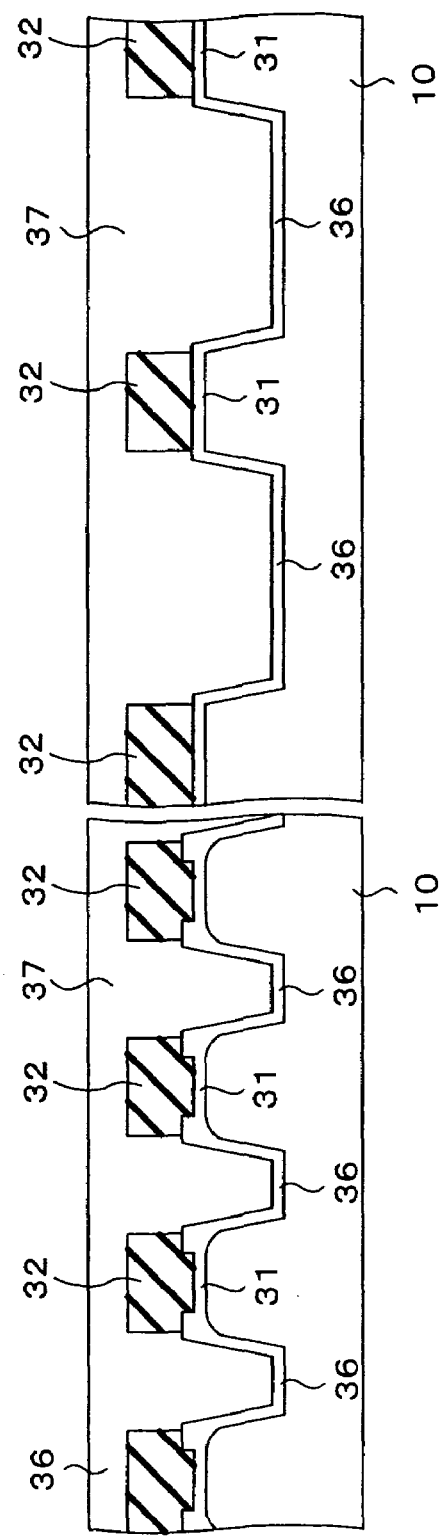
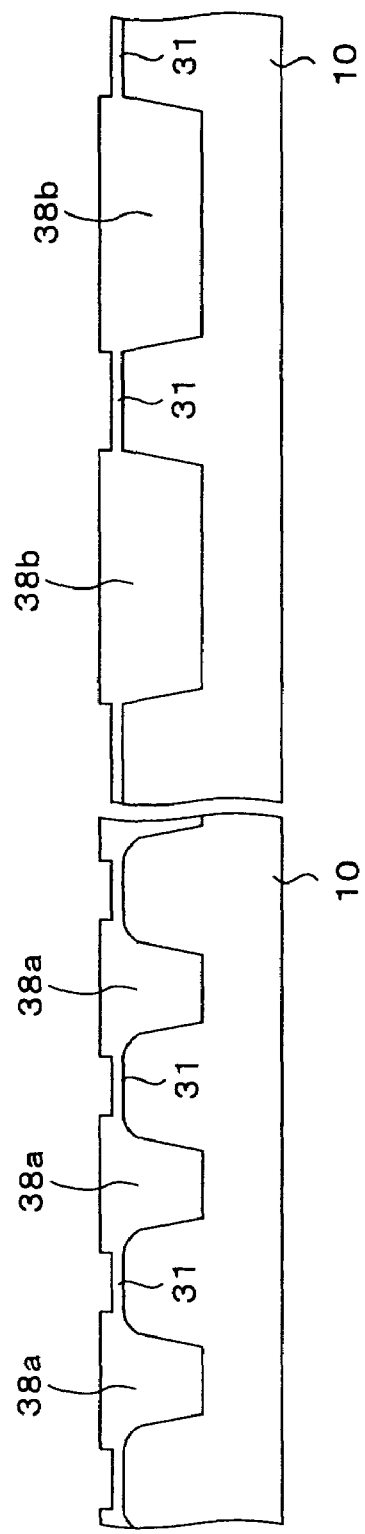
Fig. 6E
Fig. 6F

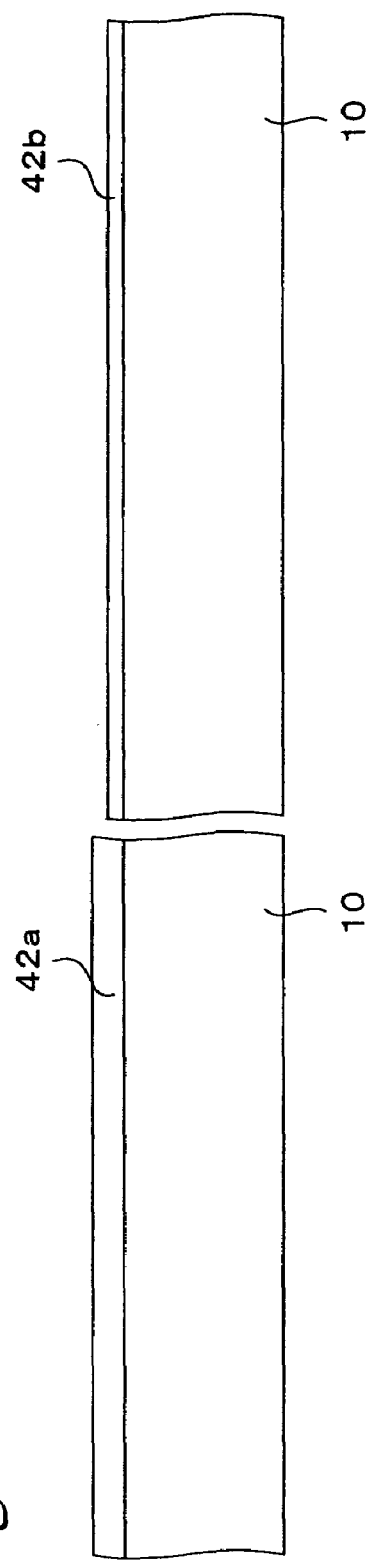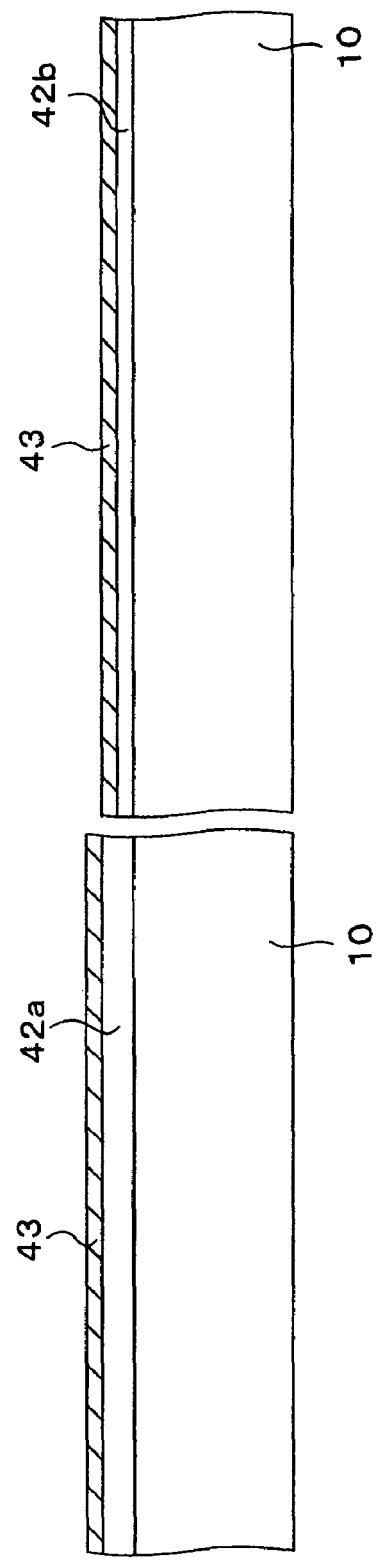

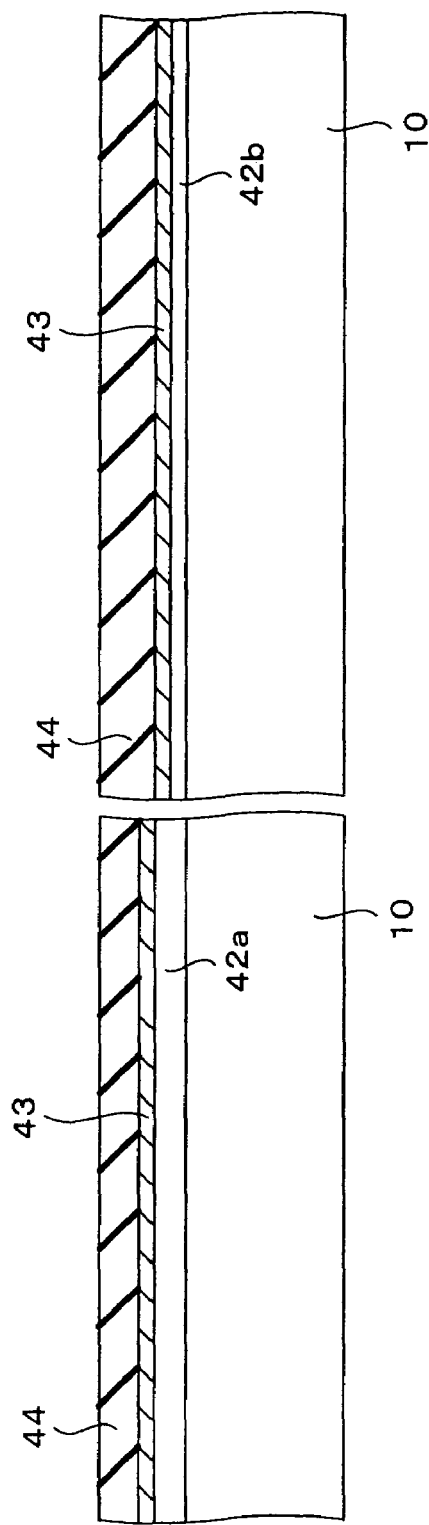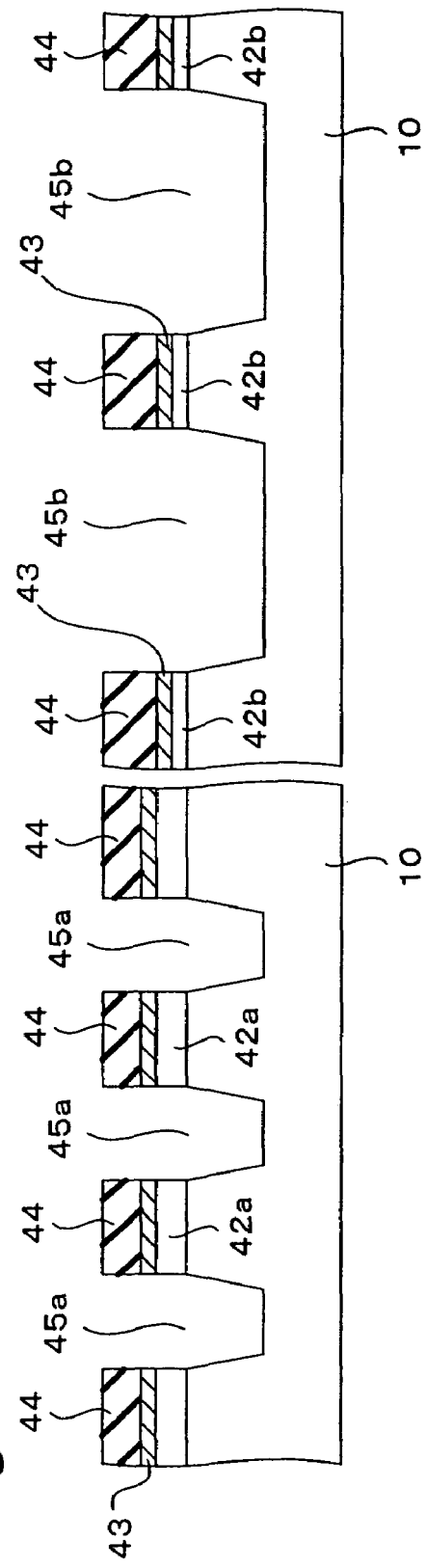

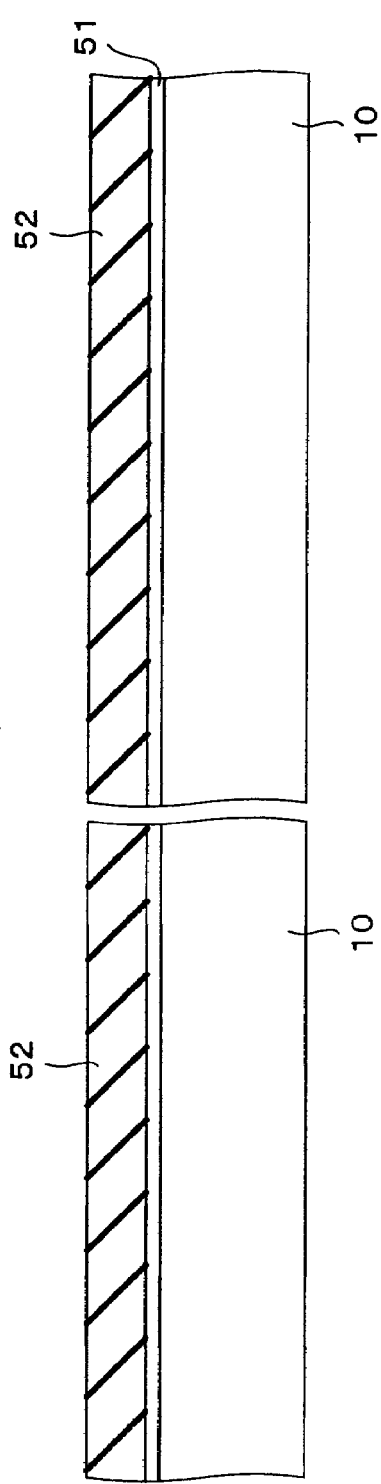
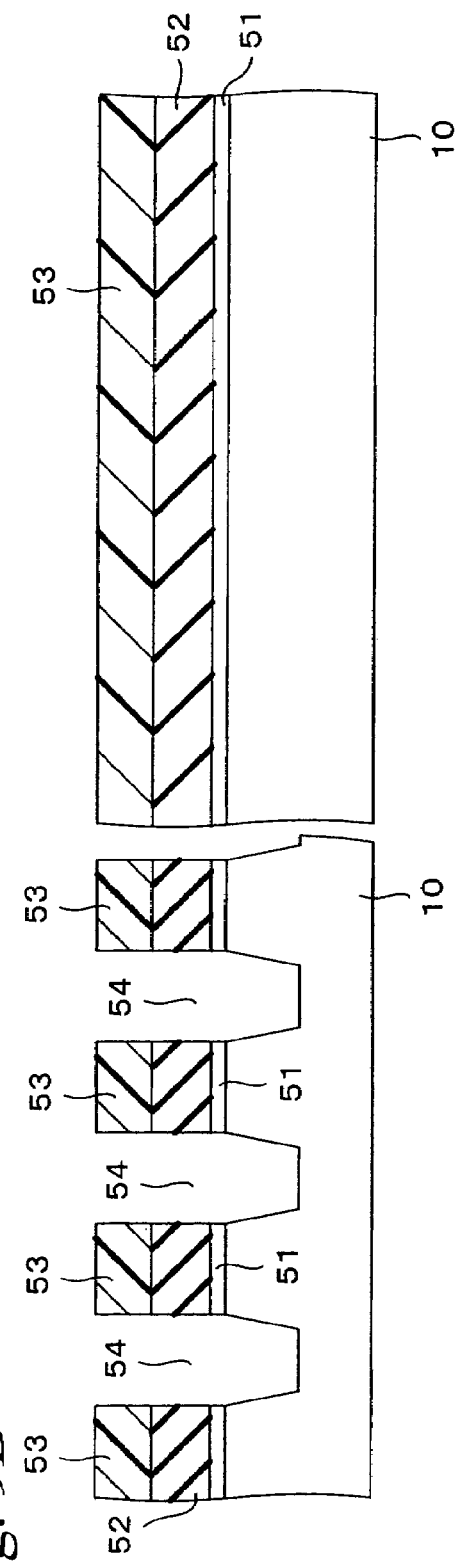
Fig. 9A
Fig. 9B

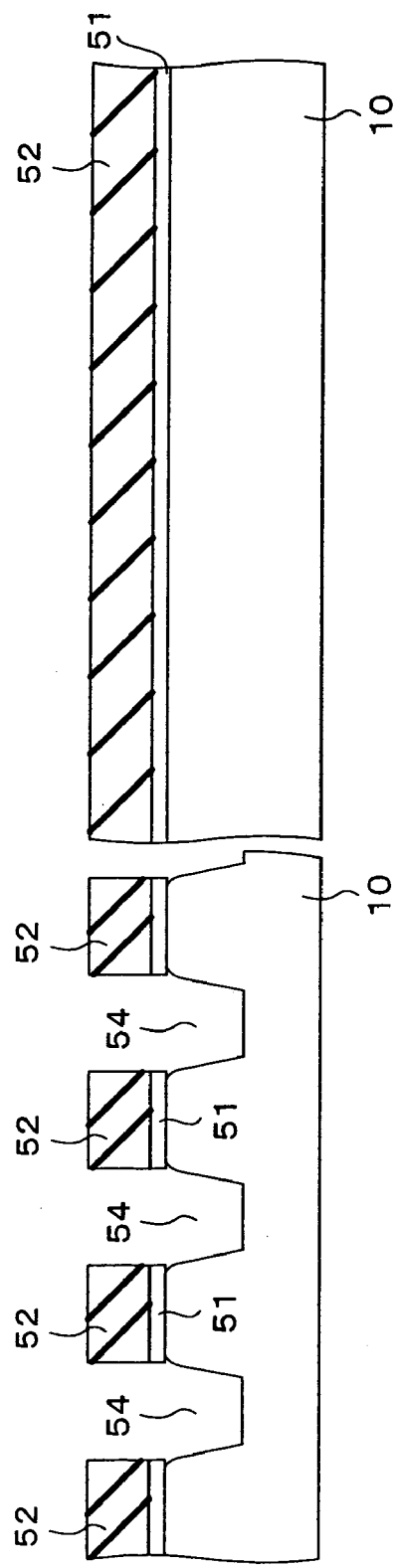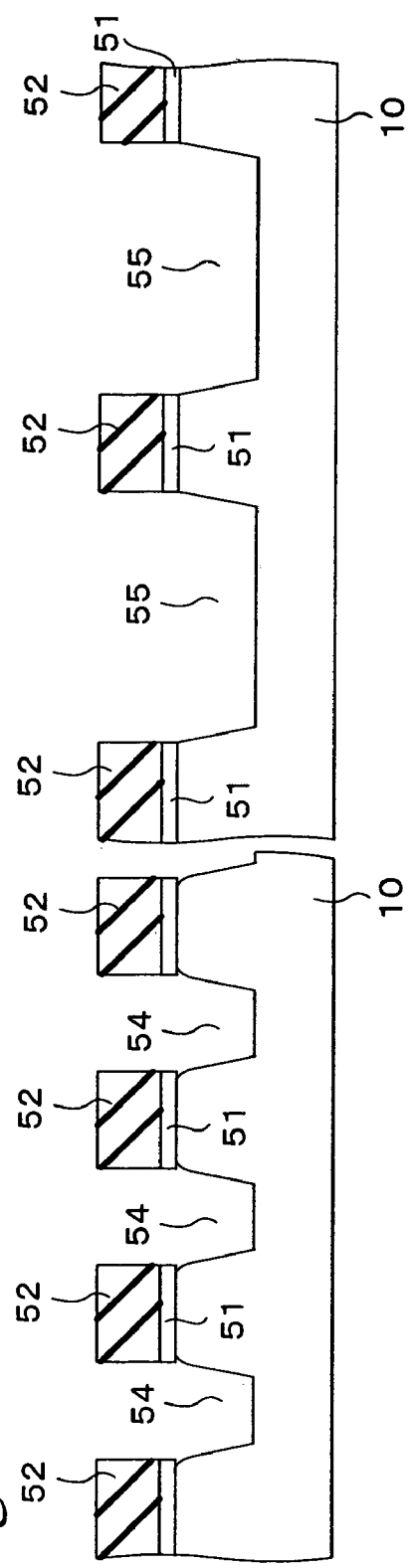

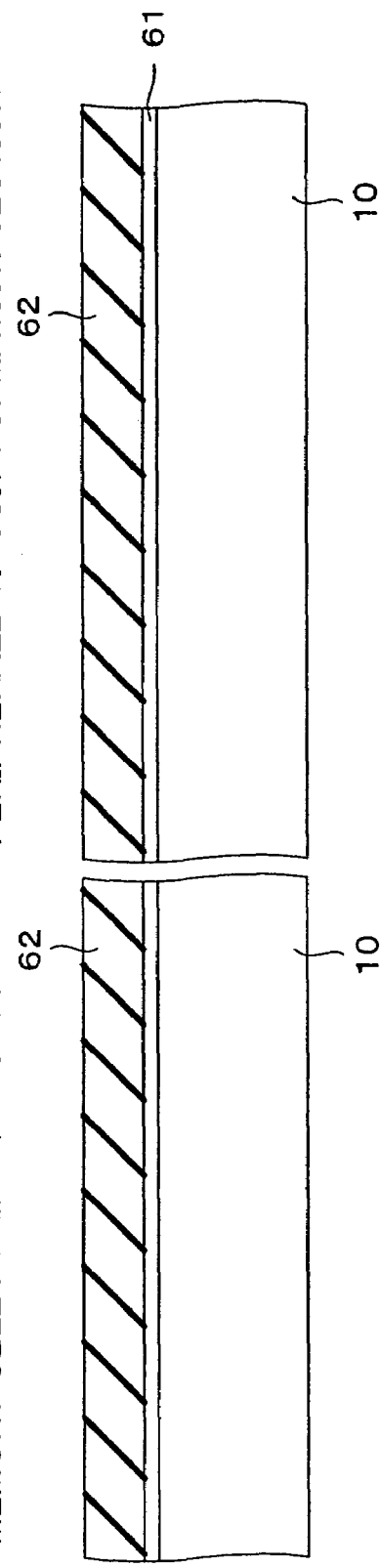
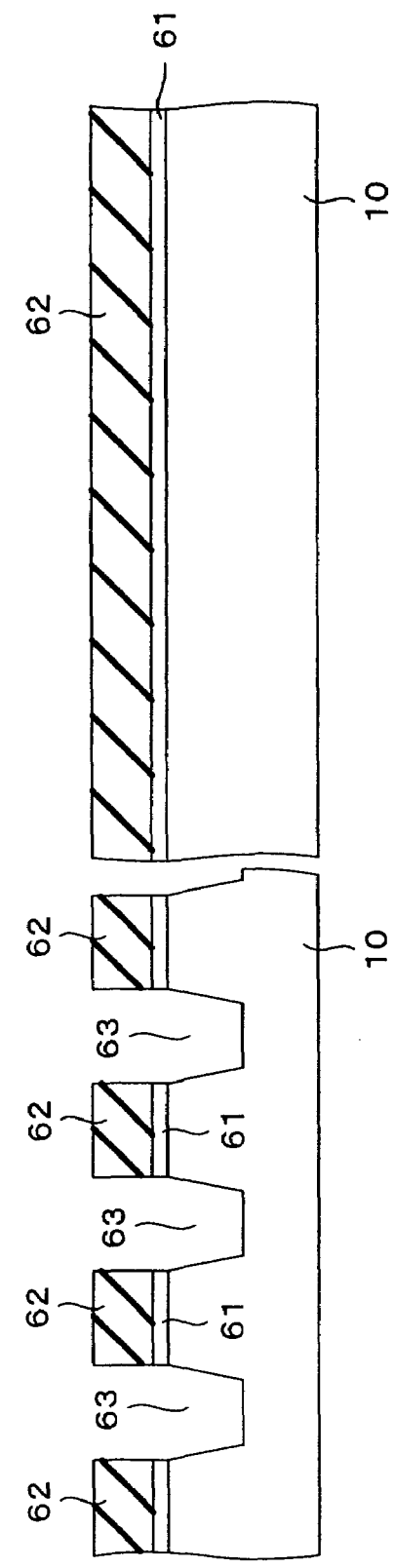

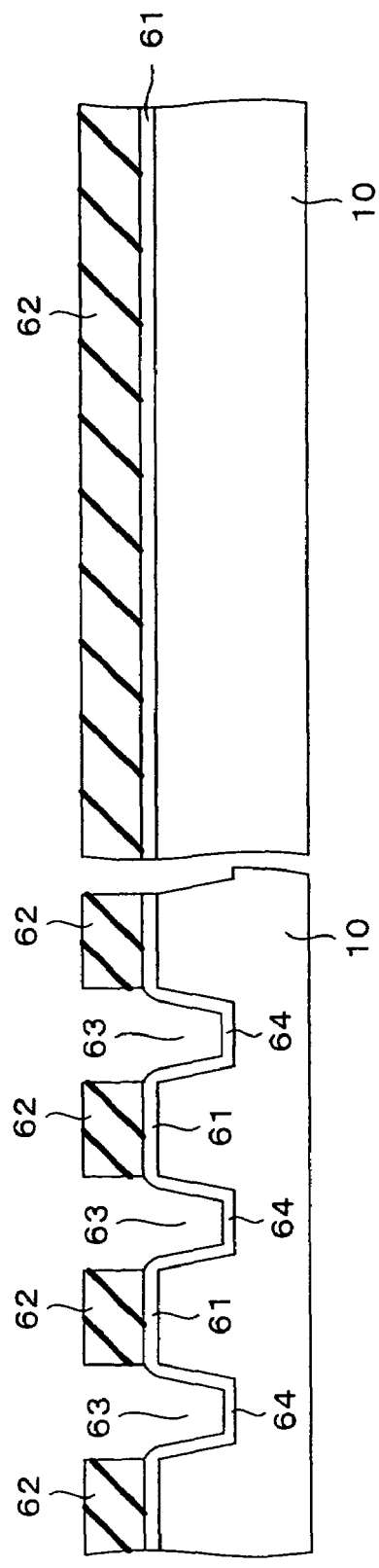
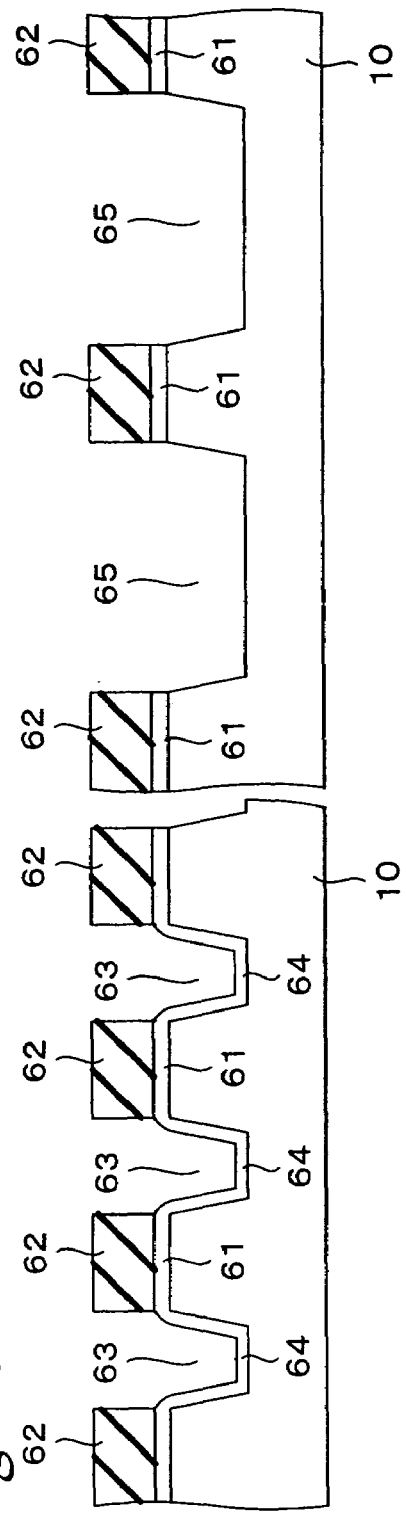

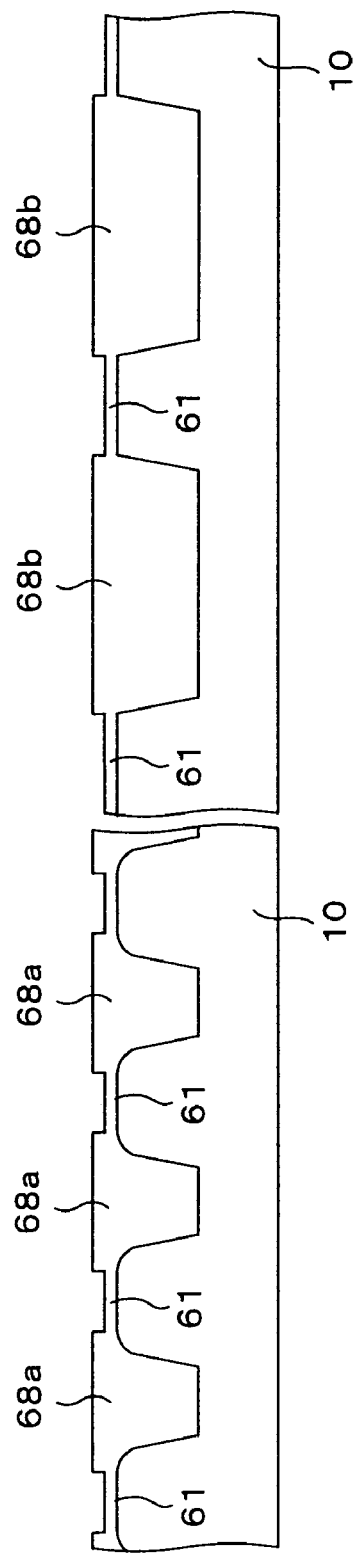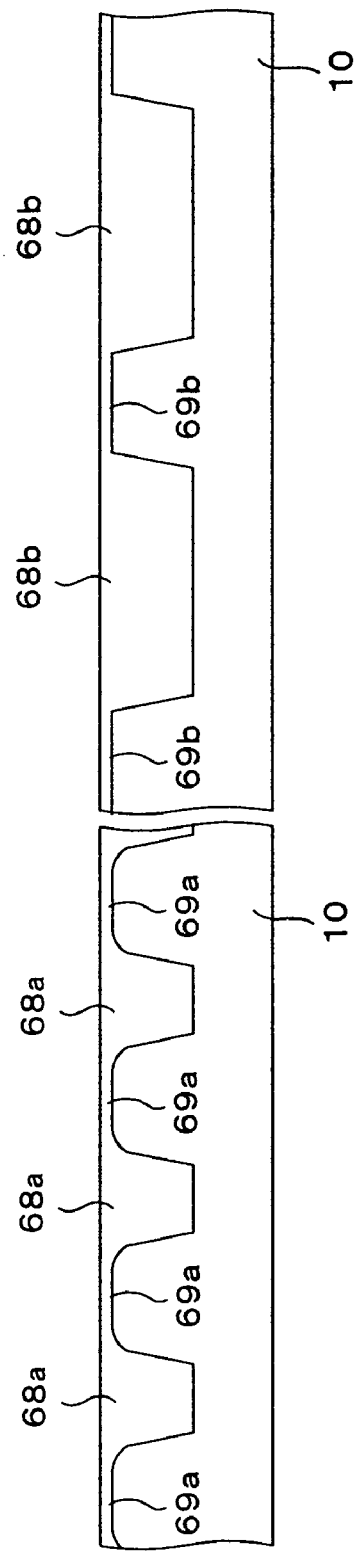

SEMICONDUCTOR DEVICE

This application is a divisional of application Ser. No. 10/647,427, filed Aug. 26, 2003 now U.S. Pat. No. 6,869,859.

CROSS-REFERENCE TO RELATED APPLICATIONS

This application is based upon and claims priority of Japanese Patent Application No. 2002-255471, filed on Aug. 30, 2002, the contents being incorporated herein by reference.

BACKGROUND OF THE INVENTION

1. Field of the Invention

The present invention relates to a semiconductor device in which element regions are isolated by trenches formed in a semiconductor substrate and a method of fabricating this semiconductor device. More particularly, the invention relates to a semiconductor device in which a transistor operating at a high voltage and a transistor operating at a low voltage are formed on the same semiconductor substrate and a method of fabricating this semiconductor device.

2. Description of the Prior Art

In recent years, collective erasing type flash memories such as EEPROMs (electrically erasable programmable read only memories) have begun to be used in IC cards etc. A memory cell of an EEPROM has two gate electrodes of a floating gate and a control gate and performs the writing/erasure of data by controlling the supply and receipt of electric charges to and from the floating gate.

A flash memory is provided with a driving circuit to drive the memory cell. Furthermore, in recent years, there has also been developed a system LSI in which a memory cell and a CPU or other logic circuits are formed on the same semiconductor substrate. Hereinafter, both a driving circuit and a logic circuit formed on the same semiconductor substrate as the memory cell are respectively referred to as a peripheral circuit.

FIGS. 1A to 1G are sectional views showing a conventional method of fabricating a semiconductor device (a flash memory) in the order of fabrication steps. Incidentally, in FIGS. 1A to 1G, the cross-section of a memory-cell formation section is shown in the left-hand part of each view, and the cross-section of a peripheral-circuit formation section is shown in the right-hand part.

First, as shown in FIG. 1A, a pad oxide film 101 is formed on a semiconductor substrate 100, and a silicon nitride film 102 is formed on the pad oxide film by the CVD (chemical vapor deposition) process. Incidentally, a film of laminated structure of a silicon oxide layer and a silicon nitride layer may sometimes be formed in place of the silicon nitride film 102.

Next, as shown in FIG. 1B, the silicon nitride film 102 is patterned to a prescribed shape by the photolithography process. Then, the pad oxide film 101 and the semiconductor substrate 100 are etched by use of this silicon nitride film 102 as a mask, thereby forming shallow trenches 103a and 103b respectively in the memory-cell formation section and peripheral-circuit formation section.

Next, as shown in FIG. 1C, a silicon oxide film 105 is formed by depositing silicon oxide on the whole surface of the top side of the semiconductor substrate 100 and the trenches 103a and 103b are embedded with the silicon oxide. After that, the silicon oxide film 105 and the silicon nitride film 102 are polished by the CMP (chemical mechanical polishing) process, for example, thereby making the surfaces of these films flat. In this step, however, it is necessary only that the silicon oxide within each of the trenches 103a and 103b be mutually isolated, and the polishing is completed before the silicon nitride film 102 is completely removed.

After that, as shown in FIG. 1D, the silicon nitride film 102 is removed by etching. Hereinafter, a film formed of the silicon oxide within the trench 103a of the memory-cell formation section is referred to as an element-isolating film 106a, and a film formed of the silicon oxide within the trench 103b of the peripheral-circuit formation section is referred to as an element-isolating film 106b.

Next, as shown in FIG. 1E, after the removal of the pad oxide film 101 by etching, a tunnel oxide film 107a and a gate oxide film 107b, each having a prescribed thickness, are formed respectively in the memory-cell formation section and the peripheral-circuit formation section by oxidizing an exposed substrate surface.

Next, as shown in FIG. 1F, a floating gate 108a, an intermediate insulating film 109 and a control gate 110a are formed in the memory-cell formation section, and a gate electrode 110b is formed on a gate oxide film 107b of the peripheral-circuit formation section. The floating gate 108a is formed on the tunnel oxide film 107a of each memory cell region, with one floating gate per tunnel oxide film, and the control gate 110a is formed so as to pass above the plurality of floating gates 108a formed in a line.

After that, a source/drain layer (not shown) is formed by doping impurities on the surface of the semiconductor substrate 100 by use of the control gate 110a and the gate electrode 110b as masks. Furthermore, an interlayer-insulating film 111 is formed on the whole surface of the top side of the semiconductor substrate 100, and the control gate 110a and the gate electrode 110b are covered with this interlayer-insulating film 111.

Subsequently, a contact hole (not shown) is formed in a prescribed position of the interlayer-insulating film 111 by the photolithography process. Then, a metal film is formed on the whole surface of the top side of the semiconductor substrate 100, and by patterning this metal film, as shown in FIG. 1G, a bit line 112a is formed in the memory-cell formation section, and an interconnection 112b is formed in the peripheral-circuit formation section. The flash memory is completed in this manner.

However, the present inventors consider that the above-described conventional method of fabricating semiconductor devices has the following problems.

FIG. 2 is an enlarged view of the shape of a top edge portion of the element-isolating film. As shown in this FIG. 2, in the conventional method the curvature of an interface between the top edge portion of the element-isolating film 106 and the semiconductor substrate 100 is small and, therefore, thinning (the phenomenon that an insulating film becomes thin in the vicinity of a corner portion) occurs. For this reason, a parasitic transistor occurs parallel to the memory cell, with the result that humps occur in the current-voltage characteristics of the memory cell, causing an increase in leakage current.

Furthermore, a high voltage of about 20 V is applied to the memory cell in contrast to the operating of the transistor in the peripheral circuit at a low voltage of 3.3 V or less. Therefore, when the curvature of the interface between the top edge portion of the element-isolating film 106 and the semiconductor substrate 100 is small, strong electric fields concentrate on this part, thereby posing the problems that the controllability of the supply and receipt of electric charges to and from the floating gate 108a decreases and that the tunnel oxide film 107a is broken.

On the other hand, it is conceivable to increase the curvature of the interface between the top edge portion of the element-isolating film 106 and the semiconductor substrate 100. In this case, however, the area of the element region inevitably becomes small, with the result that the current-driving capacity of the transistor constituting the peripheral circuit decreases, causing a decrease in the operating speed. When the curvature of the interface between the top edge portion of the element-isolating film 106 and the semiconductor substrate 100 is increased and, at the same time, the area of the element region of the peripheral-circuit formation section is increased, the problem that the high integration of the semiconductor device is impaired.

Incidentally, in Patent Application Publication (KOKAI) 2000-269450, it is proposed to increase the curvature of an end portion of the element region of the peripheral-circuit formation section to a value larger than the curvature of an end portion of the element region of the memory-cell formation section. In this case, however, it is impossible to prevent a decrease in the controllability of the supply and receipt of electric charges to and from the floating gate by the memory cell and the breakage of the tunnel oxide film. Furthermore, it is impossible to prevent a decrease in the driving capacity of the peripheral circuit and a decrease in integration density.

SUMMARY OF THE INVENTION

An object of the present invention is to provide a semiconductor device which avoids a decrease in the current-driving capacity of a transistor operating at a low voltage while ensuring the reliability of a gate-insulating film of a transistor to which a high voltage is applied, and which furthermore can achieve the high integration of the semiconductor device, and a method of fabricating this semiconductor device.

A semiconductor device of the invention comprises: a plurality of first elements formed in a first region of a semiconductor substrate; a first trench formed between the first elements of the first region; a first element-isolating film including an insulating material filling the first trench; a plurality of second elements which are formed in a second region of the semiconductor substrate and to which a voltage higher than that of the first element is supplied; a second trench formed between the second elements in the second region; and a second element-isolating film including an insulating material filling the second trench, a curvature of an interface between a top edge portion of the second element-isolating film and the semiconductor substrate being larger than a curvature of an interface between a top edge portion of the first element-isolating film and the semiconductor substrate.

In the invention, in the second element region in which the second elements to which a high voltage is supplied are formed, the curvature of the interface between the top edge portion of the element-isolating film (the second element-isolating film) and the semiconductor substrate is large. As a result of this, the concentration of electric fields on the edge of the semiconductor substrate is avoided and the breakage of the gate-insulating film and a change in the characteristics of the gate-insulating film are prevented. Furthermore, in the first element region in which elements operating at a low voltage are formed, the curvature of the interface between the top edge portion of the element-isolating film (the first element-isolating film) and the semiconductor substrate is small and, therefore, the elements can be integrated at a high density.

A method of fabricating a semiconductor device of the invention comprises the steps of: forming a plurality of first trenches in a first region of a semiconductor substrate and a plurality of second trenches in a second region of the semiconductor substrate; increasing a curvature of a top edge portion of the second trench; filling the first and second trenches with an insulating material; and forming a first element in the first region and a second element in the second region, a higher voltage than that of the first element being supplied to the second element.

For example, a first insulating film formed of silicon oxide is formed in the first and second regions on the semiconductor substrate, and a second insulating film formed of silicon nitride is formed on this first insulating film. And after the patterning of the second insulating film, by etching the first insulating film and the semiconductor substrate by use of the second insulating film as a mask, the first trenches are formed in the first region and the second trenches are formed in the second region.

After that, the side etching of the first insulating film of the second region is performed. As a result of this, a gap is formed between the semiconductor substrate around the second trenches and the second insulating film. When the inner surfaces of the trenches are oxidized, the oxidation of the surface of the semiconductor substrate around the second trenches is promoted by this gap. Therefore, the curvature of the corner of the semiconductor substrate of the top of the second trench becomes larger than the curvature of the corner of the semiconductor substrate of the top of the first trench. After that, the element-isolating film is formed by filling the first and second trenches with an insulating material, a MOS transistor or the like operating at a low voltage are formed in the first region, and elements, to which a high voltage is supplied, such as a memory cell of nonvolatile memory, are formed in the second region.

As described above, in the invention, the curvature of the interface between the top edge portion of the trench of the first region and the semiconductor substrate is decreased and, therefore, elements such as MOS transistors can be integrated at a high density. Furthermore, since the curvature of the interface between the top edge portion of the trench in the second region and the semiconductor substrate is increased, the concentration of electric fields on a part is avoided, and the breakage of the tunnel oxide film or the like and a change in the characteristics of the tunnel oxide film or the like are prevented.

As a method by which the curvature of the top edge portion of the trench in the first region is decreased and the curvature of the top edge portion of the trench in the second region is increased, as will be described in connection with the after-mentioned embodiments, there is a method which involves forming a silicon oxide film, for example, thick on the semiconductor substrate in the second region and forming a silicon oxide film thin on the semiconductor substrate in the first region. In this case, the oxidation of the substrate surface around the trenches in the second region is promoted because a relatively large volume of oxygen is supplied to the substrate surface around the trenches through the thick silicon oxide film. As a result of this, in the second region the curvature of the corner of the semiconductor substrate in the top of the trench increases in comparison with the first region.

In addition, in order to increase the curvature of the edge of the semiconductor substrate in the top of the trench, there are also a method which involves first forming trenches and then oxidizing the substrate surface after forming a gap between the semiconductor substrate and the insulating film around the trenches by performing heat treatment in a hydrogen atmosphere, a method which involves oxidizing the substrate surface after exposing the semiconductor substrate surface around trenches by appropriately controlling etching conditions in the etching process using a resist film as a mask, and the like.

BRIEF DESCRIPTION OF THE DRAWING

FIGS. 3A to 3I are sectional views showing a fabrication method of a semiconductor device (a flash memory) in a first embodiment of the present invention in the order of steps;

FIGS. 5A to 5I are sectional views showing a fabrication method of a semiconductor device (a flash memory) in a second embodiment of the present invention in the order of steps;

FIGS. 6A to 6G are sectional views showing a fabrication method of a semiconductor device (a flash memory) in a third embodiment of the present invention in the order of steps;

FIGS. 7A to 7I are sectional views showing a fabrication method of a semiconductor device (a flash memory) in a fourth embodiment of the present invention in the order of steps;

FIGS. 9A to 9H are sectional views showing a fabrication method of a semiconductor device (a flash memory) in a fifth embodiment of the present invention in the order of steps; and FIGS. 10A to 10H are sectional views showing a fabrication method of a semiconductor device (a flash memory) in a sixth embodiment of the present invention in the order of steps.

DESCRIPTION OF THE PREFERRED EMBODIMENTS

The embodiments of the present invention will be described below by referring to the attached drawings.

(First Embodiment)

FIGS. 3A to 3I are sectional views showing a fabrication method of a semiconductor device in a first embodiment of the present invention in the order of steps. Incidentally, this embodiment shows an example in which the invention is applied to the fabrication of a flash memory (EEPROM) having a memory cell and a peripheral circuit to drive the memory cell. In FIGS. 3A to 3I, the cross section of a memory-cell formation section is shown in the left-hand part of each view and the cross section of a peripheral-circuit formation section is shown in the right-hand part.

Figure 1A:
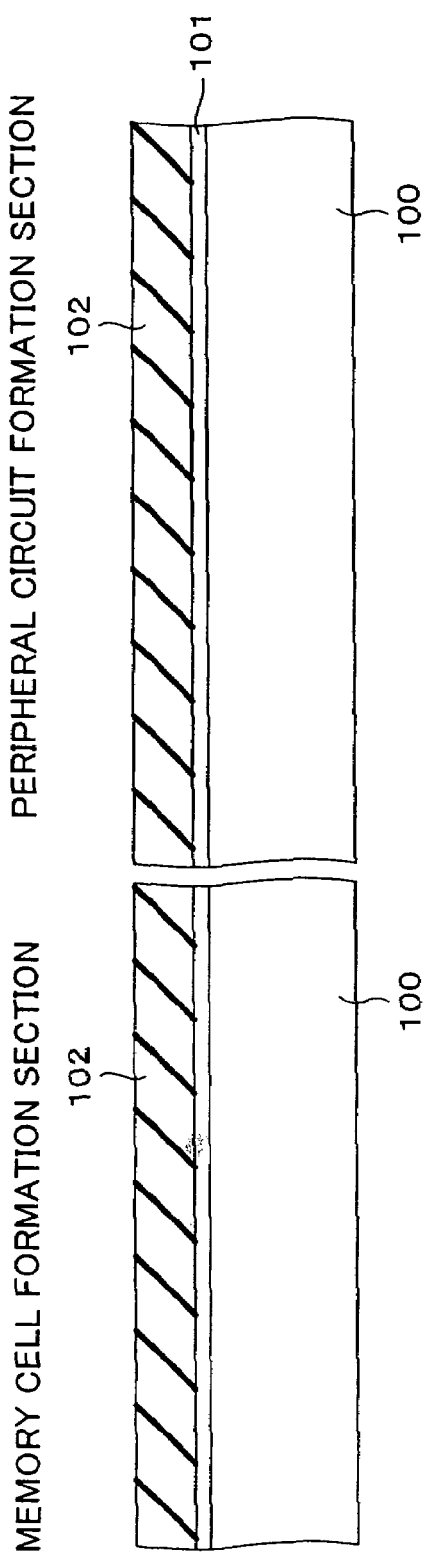
FIGS. 1A to 1G are sectional views showing a conventional fabrication method of a semiconductor device (a flash memory) in the order of steps.
Figure 1B:
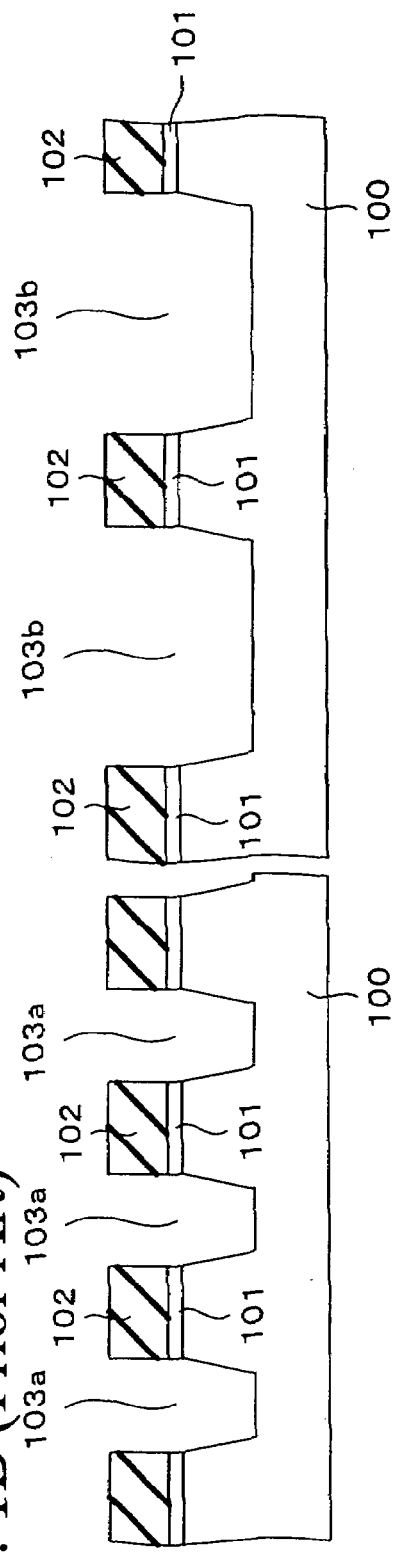
Figure 1C:
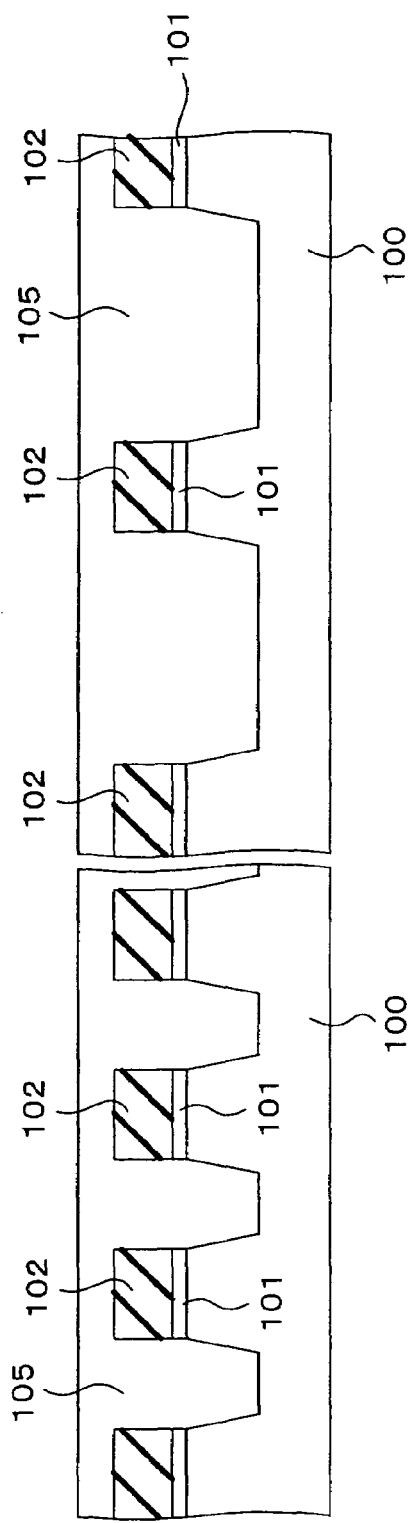
Figure 1D:
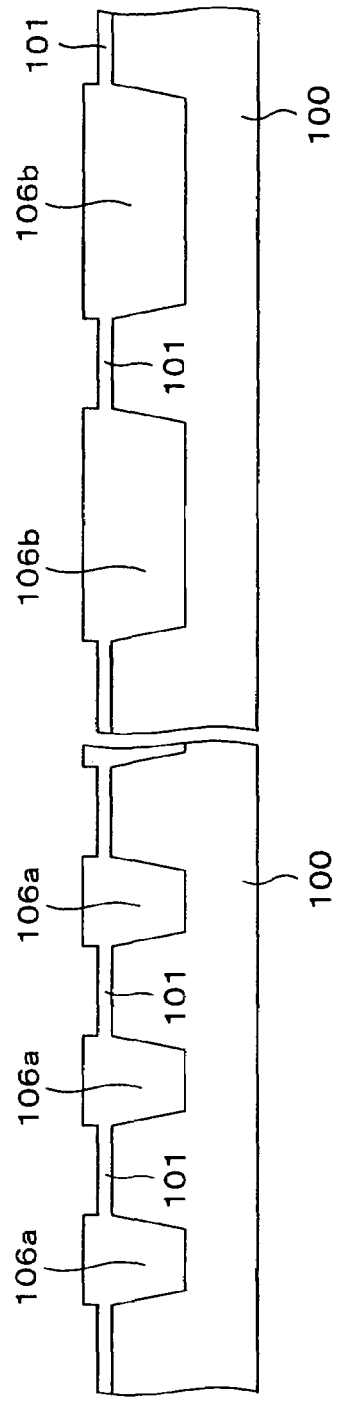
Figure 1E:
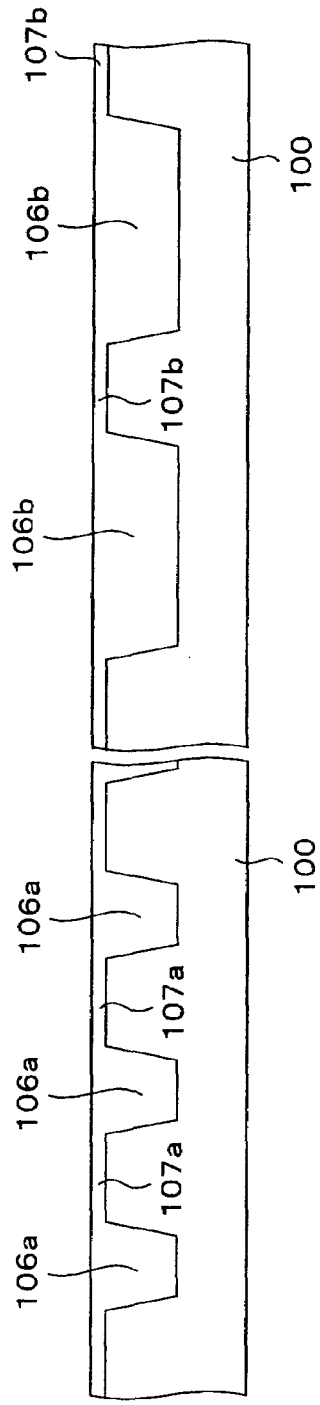
Figure 1F:
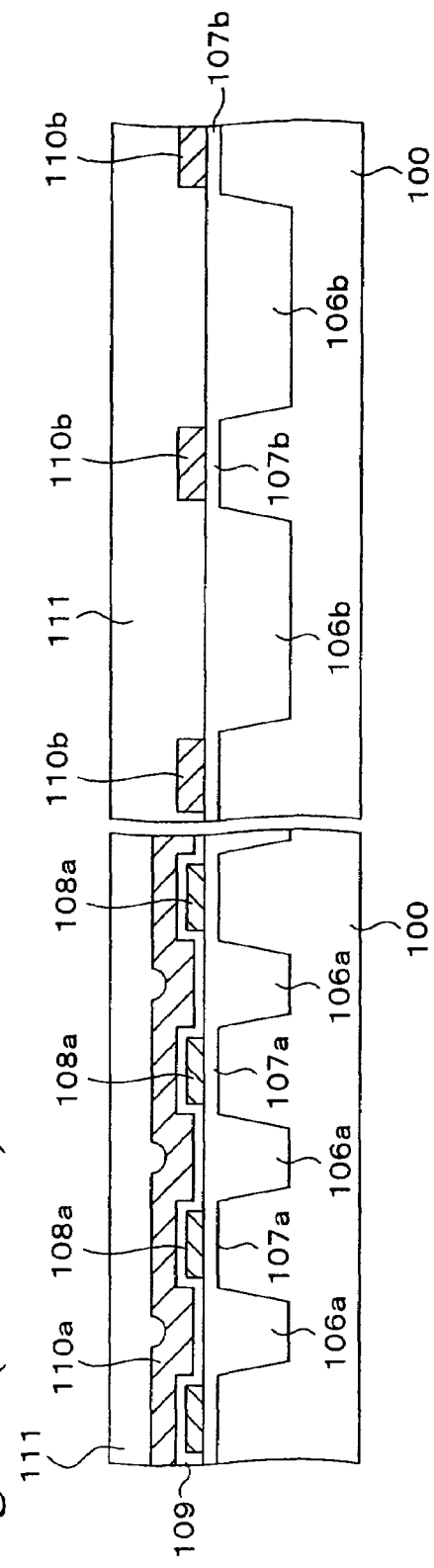
Figure 1G:
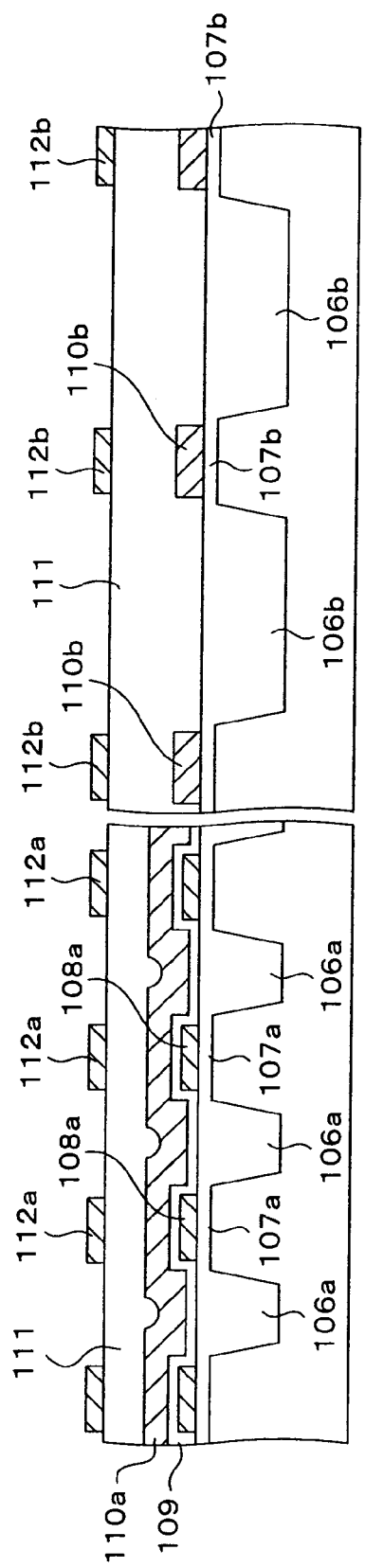
Figure 2:
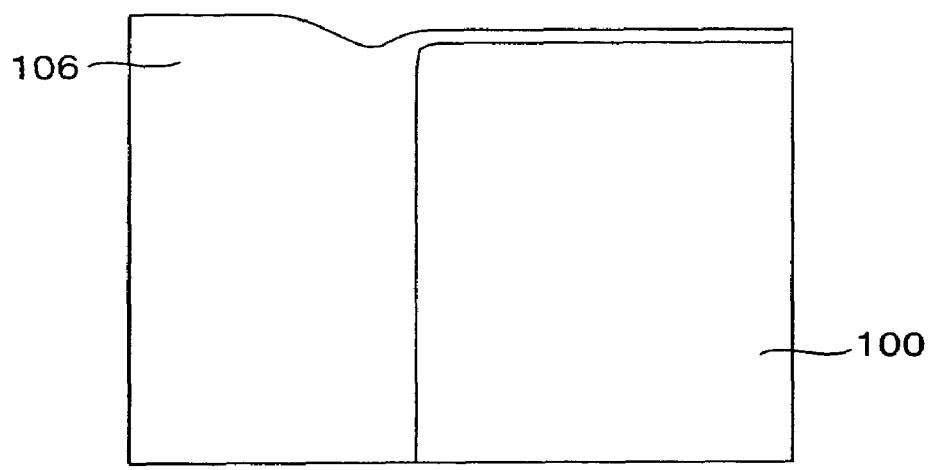
FIG. 2 is an enlarged view of the shape of a top edge portion of an element-isolating film.
Figure 3A:
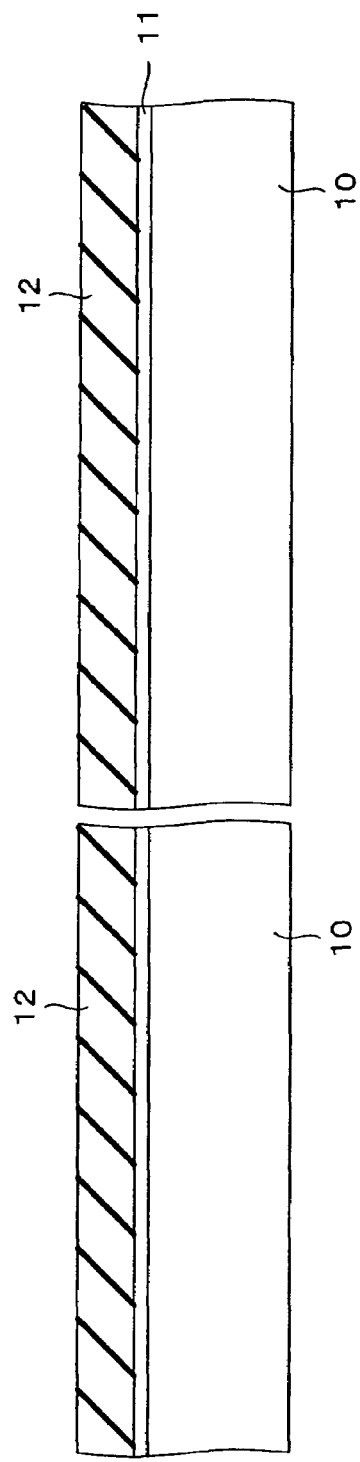

First, as shown in FIG. 3A, a pad oxide film 11 is formed on a semiconductor substrate 10 by the thermal oxidation process, for example, and a silicon nitride film 12 is formed on the pad oxide 11 film by the CVD process. Incidentally, a film of laminated structure of a silicon oxide layer and a silicon nitride layer may be formed in place of the silicon nitride film 12.

Figure 3B:
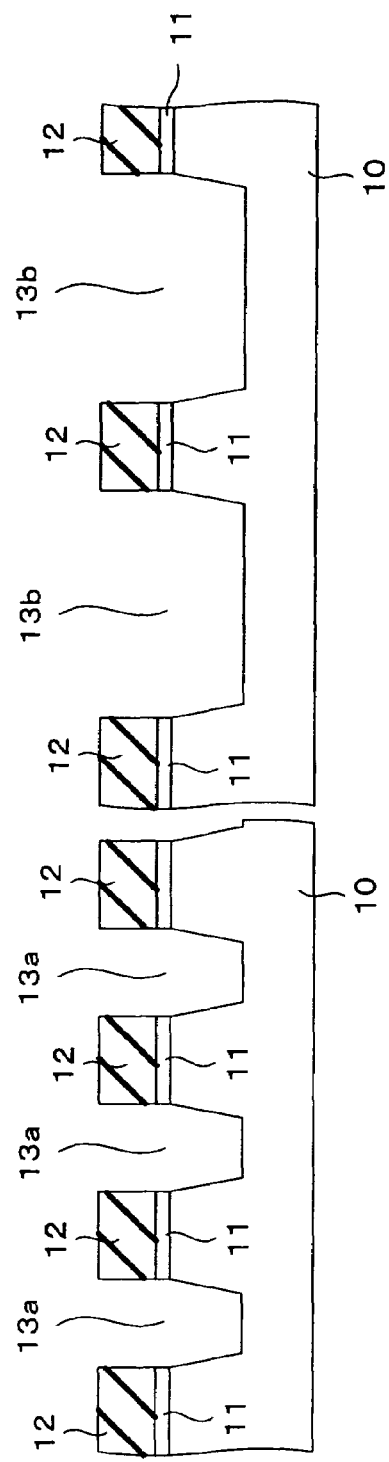

Next, as shown in FIG. 3B, by etching the silicon nitride film 12 by the photolithography process, the silicon nitride film 12 in the element-isolating region in the memory-cell formation section and peripheral-circuit formation section is removed and the silicon nitride film 12 only in the element region is left. And by etching the pad oxide film 11 and semiconductor substrate 10 by use of the remaining silicon nitride film 12 as a mask, shallow trenches 13a, 13b are formed, respectively, in the memory-cell formation section and peripheral-circuit formation section.

Next, a resist film (not shown) which covers the peripheral-circuit formation section is formed. And the edge portion of the pad oxide film 11 is etched (side etched) under conditions that provide isotropic etching with respect to the silicon oxide film. As a result of this, as shown in FIG. 3C, a gap is formed between the silicon nitride film 12 around the trench 13a and the semiconductor substrate 10. After that, the resist film is removed.

Next, by performing heat treatment in an atmosphere, for example, at a temperature of 850 to 1100□ Ž and at an oxygen concentration of 10%, a silicon oxide film 14 having a thickness of equal or more than 5 nm is formed on the inner surfaces of the trenches 13a, 13b as shown in FIG. 3D.

Since at this time in this embodiment, the gap between the semiconductor substrate 10 and the silicon nitride film 12 is prepared beforehand in the top edge portion of the trench 13a, the supply of an oxidizing agent (oxygen) to the top edge portion of the trench 13a is promoted. As a result of this, a thick oxide film (a bird's beak) is formed in this part as shown in FIG. 3D and, at the same time, the corner of the semiconductor substrate 10 around the trench 13a assumes a rounded shape.

Figure 3E:
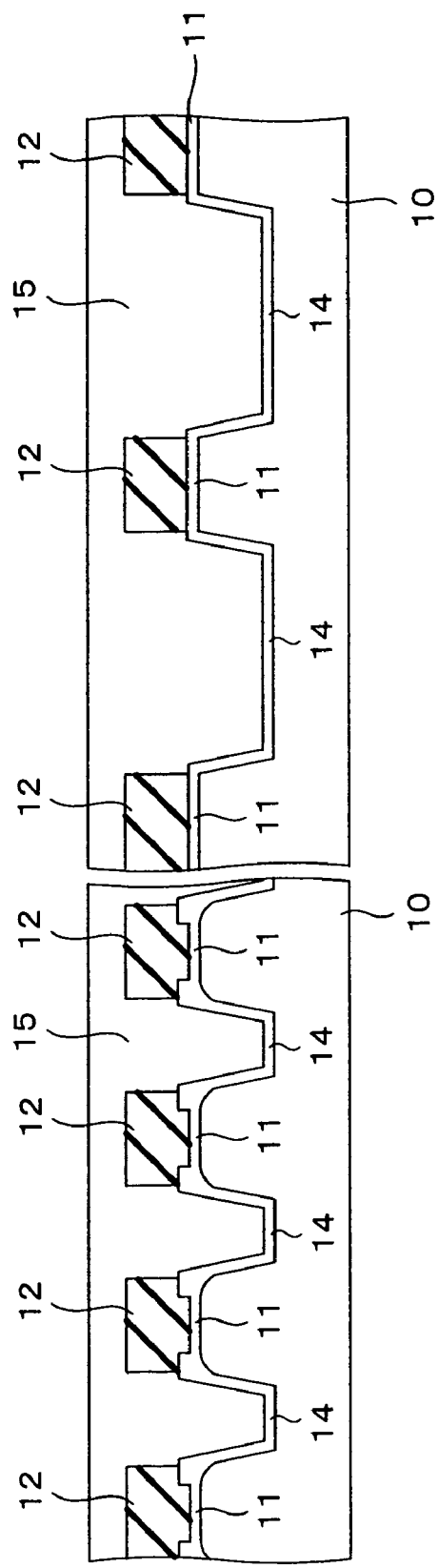
Figure 3F:
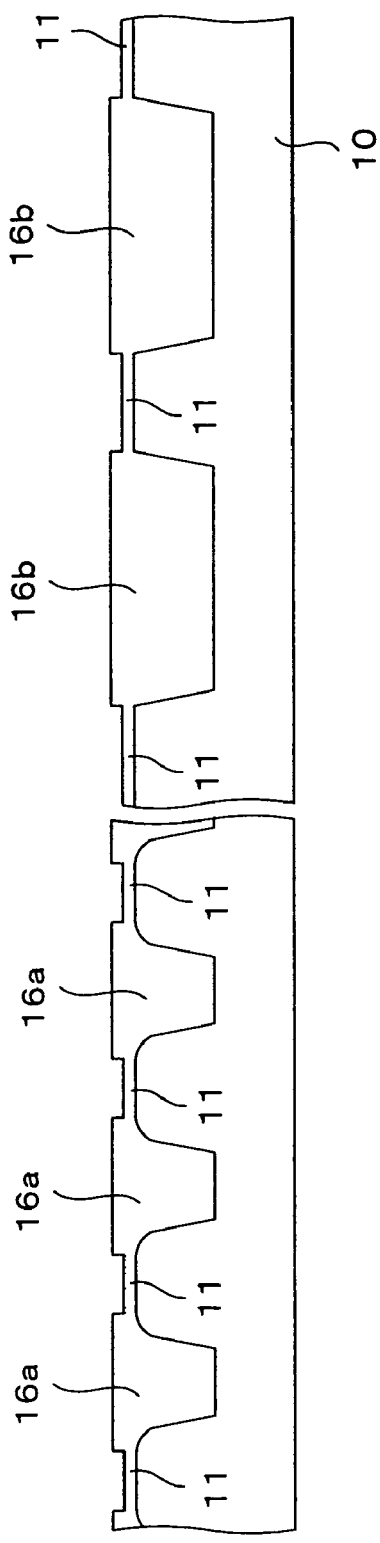

Next, as shown in FIG. 3E, a silicon oxide film 15 is formed by depositing silicon oxide on the whole surface of the top side of the semiconductor substrate 10 by the high-density plasma CVD process and the trenches 13a, 13b are embedded with the silicon oxide. After that, the silicon oxide film 15 and silicon nitride film 12 are polished by, for example, the CMP process, thereby making the surfaces of these films flat. In this step, however, it is necessary only that the silicon oxide within each of the trenches 13a, 13b be mutually isolated, and the polishing is completed before the silicon nitride film 12 is completely removed. Furthermore, in place of the polishing of the silicon oxide film 15 by the CMP process, the silicon oxide film 15 may be etched back until the side surface of the silicon nitride film 12 is exposed to a certain degree Next, as shown in FIG. 3F, the silicon nitride film 12 is removed by wet etching by use of, for example, hot phosphoric acid. Hereinafter, a film formed of the silicon oxide within the trench 13a of the memory-cell formation section is referred to as an element-isolating film 16a and a film formed of the silicon oxide within the trench 13b of the peripheral-circuit formation section is referred to as an element-isolating film 16b.

Next, the surface of the semiconductor substrate 10 is exposed by removing the pad oxide film 11 by etching. At this time the element-isolating films 16a, 16b are also etched, resulting in a decrease in film thickness. After that, by performing the thermal oxidation of the surface of the semiconductor substrate 10 exposed by the removal of the pad oxide film 11, as shown in FIG. 3G, a tunnel oxide film 17a is formed in the memory-cell formation section and a gate oxide film 17b is formed in the peripheral-circuit formation section. The film thicknesses of these tunnel oxide film 17a and gate oxide film 17b are set in accordance with the respective required specifications.

Next, as shown in FIG. 3H, a floating gate 18a, an intermediate insulating film 19 and a control gate 20a are formed in the memory-cell formation section, and a gate electrode 20b is formed on a gate oxide film 17b of the peripheral-circuit formation section. The floating gate 18a is formed on the tunnel oxide film 17a of each memory cell region, with one floating gate 18a per tunnel oxide film 17a. Furthermore, the control gate 20a is formed so as to pass above the plurality of floating gates 18a formed in a line.

After that, a source/drain layer (not shown) is formed by doping impurities on the surface of the semiconductor substrate 10 by use of the control gate 20a and gate electrode 20b as masks. Furthermore, an interlayer-insulating film 21 formed of silicon oxide, for example, is formed on the whole top surface of the semiconductor substrate 10 and the control gate 20a and gate electrode 20b are covered with this interlayer-insulating film 21.

Figure 3I:
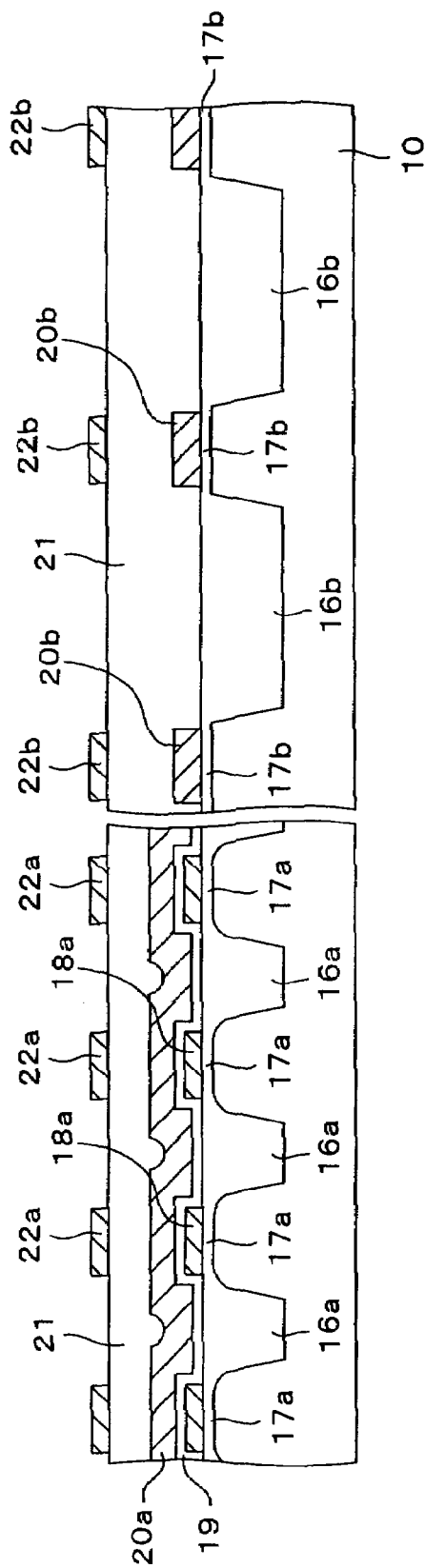

Next, a contact hole (not shown) is formed in a prescribed position of the interlayer-insulating film 21 by the photolithography process. And a metal film is formed on the whole top surface of the semiconductor substrate 10, and by patterning this metal film, as shown in FIG. 3I, a bit line 22a is formed in the memory-cell formation section and a prescribed interconnection 22b is formed in the peripheral-circuit formation section. The flash memory is completed in this manner.

Figure 4A:
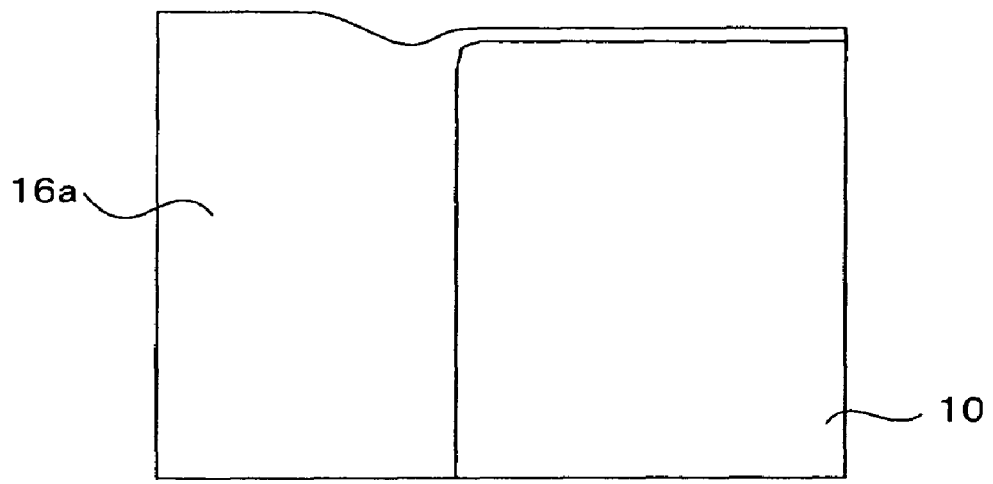
FIG. 4A is an enlarged view of a top edge portion of a trench in a memory-cell formation section of the semiconductor device in the first embodiment.
Figure 4B:
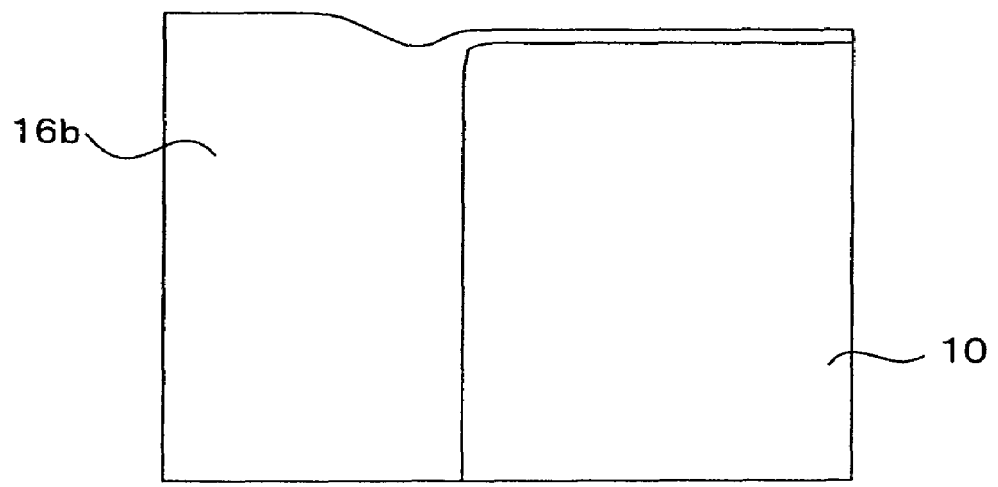
FIG. 4B is an enlarged view of a top edge portion of a trench in a peripheral-circuit formation section.

In this embodiment, as shown in FIG. 3C, by side etching the pad oxide film 11, a gap is formed between the semiconductor substrate 10 of the top edge portion of the trench 13a of the memory-cell formation section and the silicon nitride film 12. Due to this gap, the oxidation of the top edge portion of the trench 13a is promoted when the inner surface of the trench 13a is oxidized and, as a result, the curvature of the top corner of the semiconductor substrate 10 increases as shown in FIG. 4A. On the other hand, since in the peripheral-circuit formation section, the pad oxide film 11 is not side etched, the oxidation of the edge of the trench 13b is suppressed and, as a result, the curvature of the top corner of the semiconductor substrate 10 decreases as shown in FIG. 4B.

As a result of this, a change in the characteristics by thinning and the concentration of electric fields is avoided in the memory-cell formation section and a decrease in the current-driving capacity is avoided in the peripheral-circuit formation section. Furthermore, because in this embodiment the prescribed current-driving capacity can be obtained without an expansion of the element region of the peripheral-circuit formation section, the high integration of the semiconductor device becomes possible.

Furthermore, in this embodiment the interface between the semiconductor substrate 10 and the top edge portion of the element-isolating film 16a obtains a curved surface of large curvature and the tunnel oxide film can be formed with a uniform thickness. Therefore, the reliability of the tunnel oxide film 17a is high.

(Second Embodiment)

FIGS. 5A to 5I are sectional views showing a fabrication method of a semiconductor device (a flash memory) in a second embodiment of the present invention in the order of steps. In these FIGS. 5A to 5I, the section of a memory-cell formation section is shown in the left-hand part of each view and the section of a peripheral-circuit formation section is shown in the right-hand part.

First, as shown in FIG. 5A, a pad oxide film 21 is formed on a semiconductor substrate 10 by, for example, the thermal oxidation process. And the memory-cell formation section is covered with a resist film (not shown) and, as shown in FIG. 5B, the pad oxide film 21 of the peripheral-circuit formation section is removed.

Next, as shown in FIG. 5C, by performing again the thermal oxidation of the surface of the semiconductor substrate 10, a pad oxide film 22a is formed in the memory-cell formation section and a pad oxide film 22b is formed in the peripheral-circuit formation section.

Figure 5C:
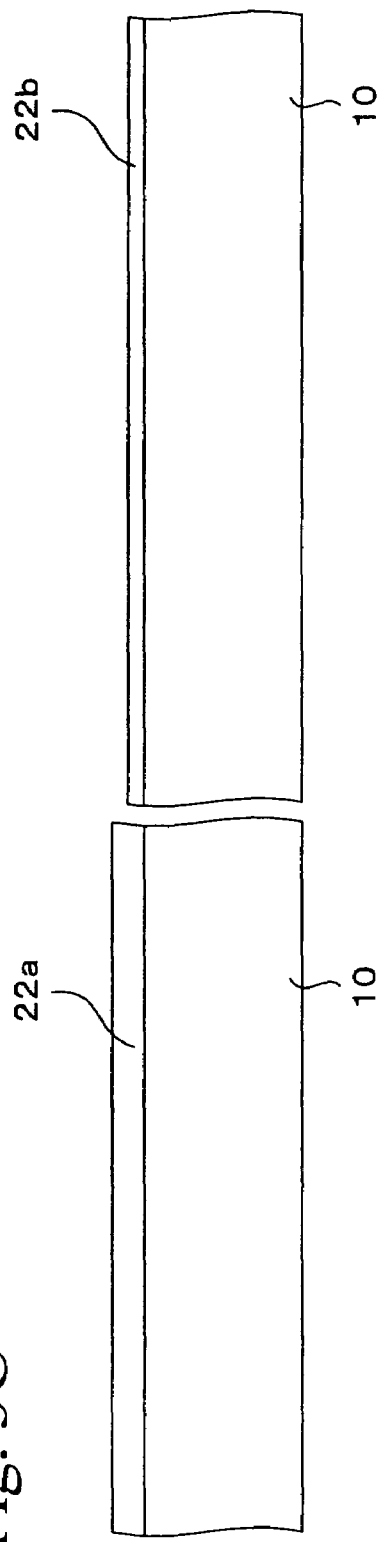
Figure 5D:
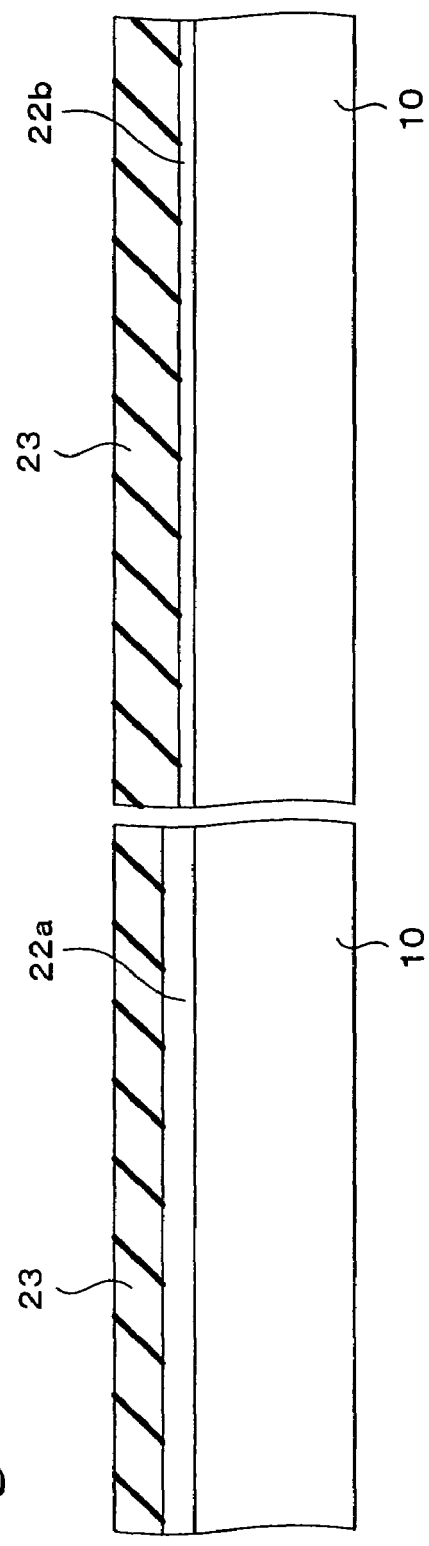

Next, as shown in FIG. 5D, a silicon nitride film 23 is formed on the pad oxide films 22a, 22b by the CVD process. A film of laminated structure of a silicon oxide layer and a silicon nitride layer may be formed in place of the silicon nitride film 23.

Next, as shown in FIG. 5E, by etching the silicon nitride film 23 by the photolithography process, the silicon nitride film 23 in the element-isolating region is removed and the silicon nitride film 23 is left only in the element region. And by etching the pad oxide films 22a, 22b and semiconductor substrate 10 by use of the remaining silicon nitride film 23 as a mask, shallow trenches 24a, 24b are formed respectively in the memory-cell formation section and peripheral-circuit formation section.

Next, by performing heat treatment in an atmosphere, for example, at a temperature of 850 to 1100□ Ž and at an oxygen concentration of 10%, a silicon oxide film 25 having a thickness of equal or more than 5 nm is formed on inner surfaces of the trenches 24a, 24b as shown in FIG. 5F.

Since at this time the pad oxide film 22a is formed thick around the trench 24a of the memory-cell formation section, a relatively large volume of oxidizing agent (oxygen) is supplied to the substrate surface around the trench 24a through the pad oxide film 22a. As a result of this, the corner of the semiconductor substrate 10 around the trench 24a assumes a rounded shape as shown in FIG. 5F□ D Next, as shown in FIG. 5G, a silicon oxide film 26 is formed by depositing silicon oxide on the whole top surface of the semiconductor substrate 10 by the high-density plasma CVD process and the trenches 24a, 24b are embedded with the silicon oxide. After that, the silicon oxide film 26 and silicon nitride film 23 are polished by, for example, the CMP process, thereby making the surfaces of these films flat. In this step, it is necessary only that the silicon oxide within each of the trenches 24a, 24b be mutually isolated, and the polishing is completed before the silicon nitride film 23 is completely removed. In place of the polishing of the silicon oxide film 26 by the CMP process, the silicon oxide film 26 may be etched until the side surface of the silicon nitride film 23 is exposed to a certain degree.

Next, as shown in FIG. 5H, the silicon nitride film 23 is removed by use of, for example, hot phosphoric acid. Hereinafter, a film formed of the silicon oxide within the trench 24a of the memory-cell formation section is referred to as an element-isolating film 27a and a film formed of the silicon oxide within the trench 24b of the peripheral-circuit formation section is referred to as an element-isolating film 27b.

Figure 5I:
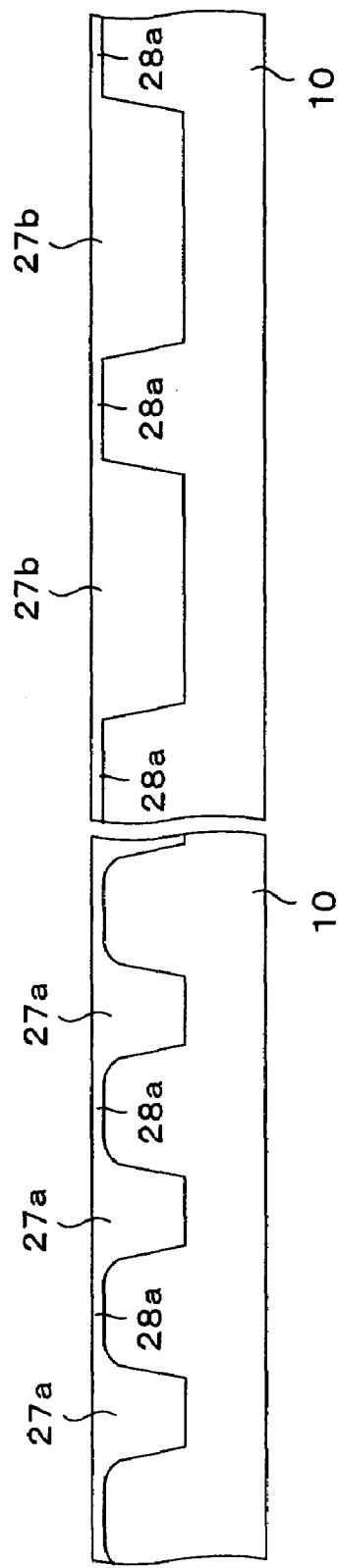

Next, as shown in FIG. 5I, the surface of the substrate 10 is exposed by etching the pad oxide films 22a, 22b. At this time the element-isolating films 27a, 27b are also etched, resulting in a decrease in film thicknesses. After that, by performing the thermal oxidation of the surface of the semiconductor substrate 10 exposed by the etching of the pad oxide films 22a, 22b, a tunnel oxide film 28a is formed in the memory-cell formation section and a gate oxide film 28b is formed in the peripheral-circuit formation section. The film thicknesses of these tunnel oxide film 28a and gate oxide film 28b is set in accordance with the respective required specifications.

Subsequently, in the same manner as in the first embodiment, a floating gate, an intermediate insulating film and a control gate are formed in the memory-cell formation section, a gate electrode is formed in the peripheral-circuit formation section, and furthermore an interlayer-insulating film, a bit line and other interconnections are formed (refer to FIG. 3I). The flash memory is completed in this manner.

In this embodiment, as shown in FIG. 5C, the thick pad oxide film 22a is formed in the memory-cell formation section. For this reason, when the inner surface of the trench 24a is oxidized, a relatively large volume of oxidizing agent (oxygen) is supplied to the top edge portion of the trench 24a through the pad oxide film 22a and the oxidation of the top edge portion of the trench 24a is promoted, with the result that, as shown in FIG. 5F, the curvature of the corner of the semiconductor substrate 10 around the trench 24a increases. On the other hand, in the peripheral-circuit formation section, the pad oxide film 22b is thin and, therefore, the oxygen volume in the edge portion of the trench 24b is small, with the result that, as shown in FIG. 5F, the curvature of the corner of the semiconductor substrate 10 around the trench 24b decreases. Because of this, also in this embodiment, the same effect as with the first embodiment can be obtained.

Furthermore, since in this embodiment the curvature of the corner of the semiconductor substrate 10 around the trench 24a is determined by the thickness of the pad oxide film 22a, this embodiment has the advantage that the control of the curvature is easy compared with the first embodiment.

(Third Embodiment)

FIGS. 6A to 6G are sectional views showing a fabrication method of a semiconductor device (a flash memory) in a third embodiment of the present invention in the order of steps. In these FIGS. 6A to 6G, the section of a memory-cell formation section is shown in the left-hand part of each view and the section of a peripheral-circuit formation section is shown in the right-hand part.

Figure 6A:
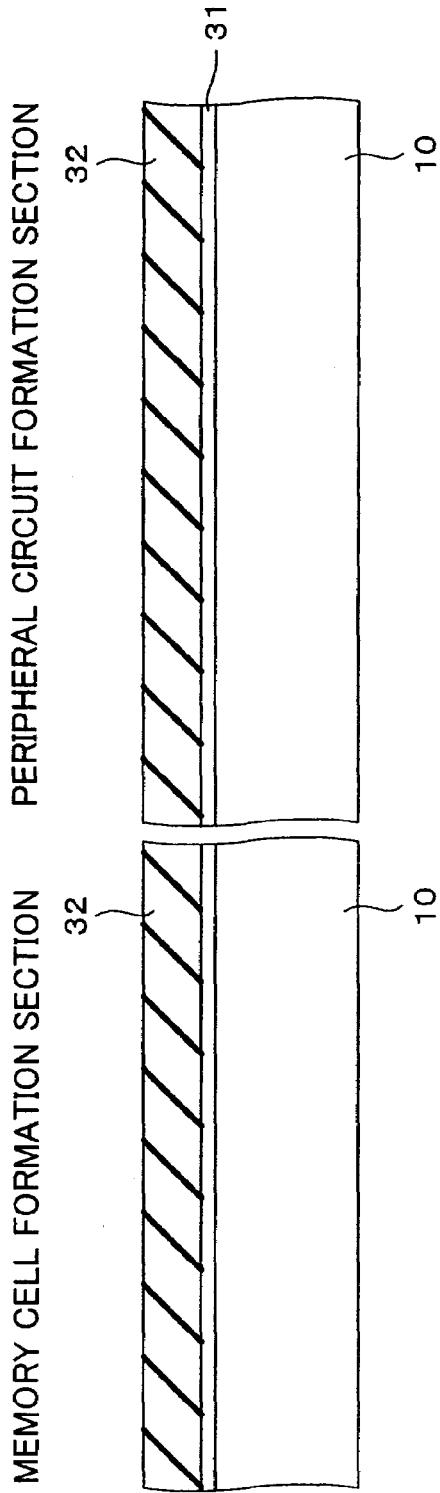

First, as shown in FIG. 6A, a pad oxide film 31 is formed on a semiconductor substrate 10 by, for example, the thermal oxidation process, and a silicon nitride film 32 is formed on the pad oxide film 31 by the CVD process. A film of laminated structure of a silicon oxide layer and a silicon nitride layer may be formed in place of the silicon nitride film 32.

Figure 6B:
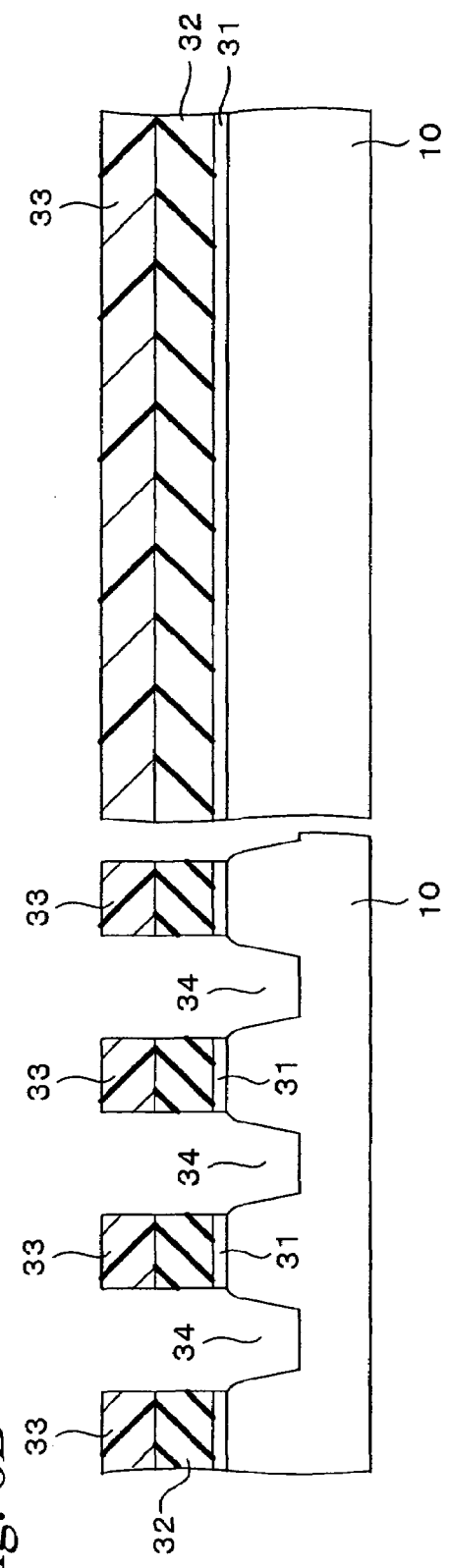

Next, as shown in FIG. 6B, a resist film 33 having an opening in a part corresponding to the element-isolating region of the memory-cell formation section is formed on a silicon nitride film 32. And after the sequential etching of the silicon nitride film 32 and pad oxide film 31 by use of this resist film 33 as a mask, a shallow trench 34 is formed by further etching the semiconductor substrate 10.

When at this time etching conditions are appropriately controlled, an organic substance (an organic substance released from the resist film 33) covers the substrate surface in the vicinity of the resist film 33 as the etching proceeds, enabling the width of the trench 34 to be made narrower than the width of the opening of the resist film 33 as shown in FIG. 6B. The resist film 33 is removed after the formation of the trench 34.

Figure 6C:
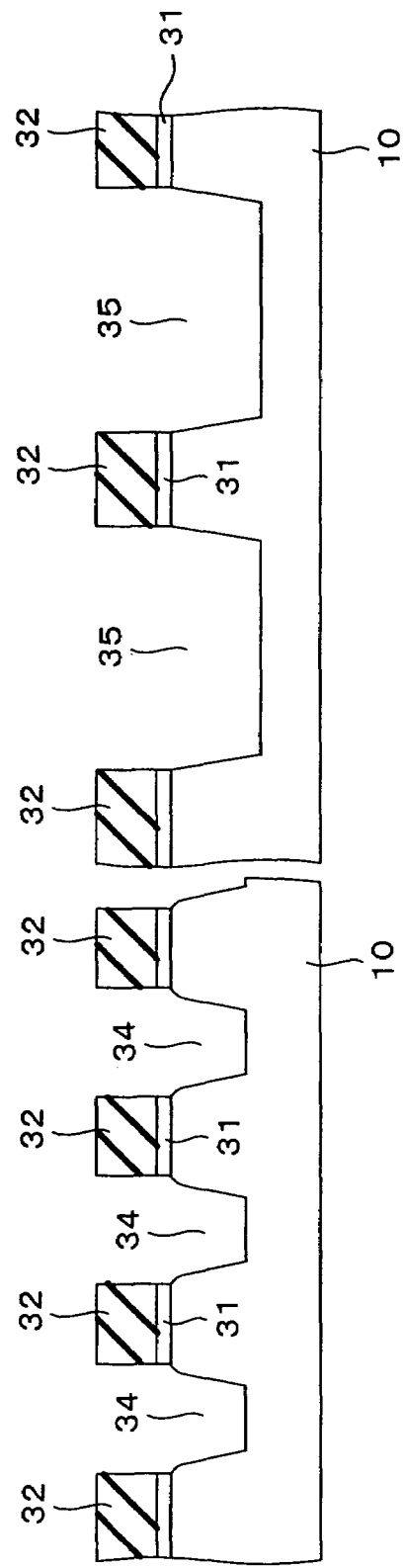

Next, a resist film (not shown) which has an opening in a part corresponding to the element-isolating region of the peripheral-circuit formation section is formed. And the resist film is removed after the etching of the silicon nitride film 32 by use of this resist film as a mask. After that, by etching the pad oxide film 31 of the peripheral-circuit formation section and semiconductor substrate 10 by use of the silicon nitride film 32 as a mask, a shallow trench 35 is formed as shown in FIG. 6C.

Figure 6D:
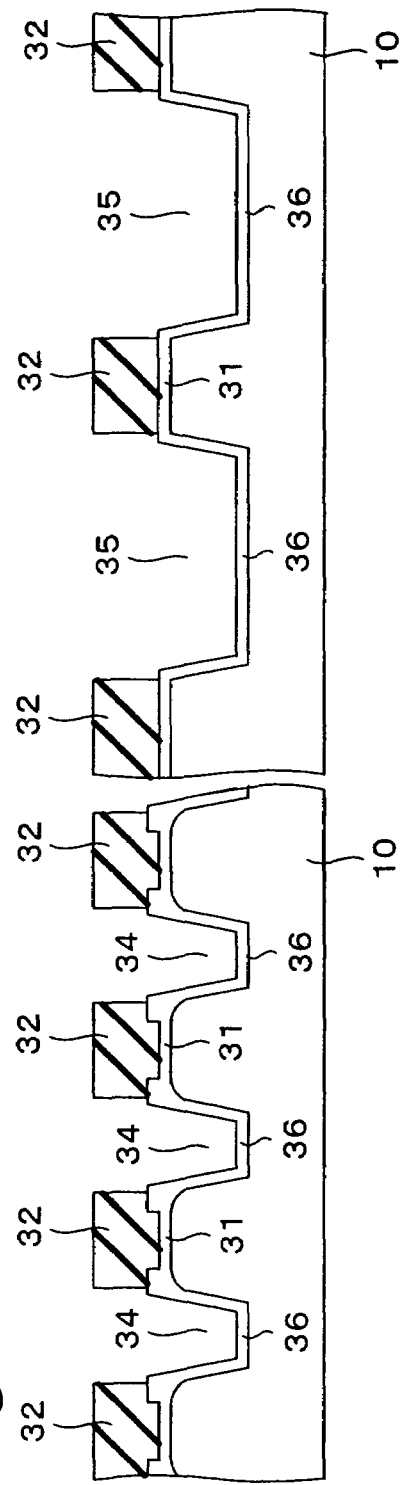

Next, by performing heat treatment in an atmosphere, for example, at a temperature of 850 to 1100□ Ž and at an oxygen concentration of 10%, a silicon oxide film 36 having a thickness of equal or more than 5 nm is formed on the inner surfaces of the trenches 34, 35 as shown in FIG. 6D.

Since at this time in this embodiment, the top surface of the semiconductor substrate 10 is exposed to the top edge portion of the trench 34, an oxidizing agent (oxygen) is supplied to the edge portion of the trench 34, with the result that as shown in FIG. 6D, a thick oxide film (a bird's beak) is formed and, at the same time, the corner of the semiconductor substrate 10 around the trench 34 assumes a rounded shape.

Next, as shown in FIG. 6E, a silicon oxide film 37 is formed by depositing silicon oxide on the top whole surface of the semiconductor substrate 10 by the high-density plasma CVD process and the trenches 34a, 35b are embedded with the silicon oxide. After that, the silicon oxide film 37 and silicon nitride film 32 are polished by, for example, the CMP process, thereby making the surfaces of these films flat. In this step, however, it is necessary only that the silicon oxide within each of the trenches 34, 35 be mutually isolated, and the polishing is completed before the silicon nitride film 32 is completely removed. Furthermore, in place of the polishing of the silicon oxide film 37 by the CMP process, the silicon oxide film 37 may be etched back until the side surface of the silicon nitride film 32 is exposed to a certain degree.

Next, as shown in FIG. 6F, the silicon nitride film 32 is removed by wet etching by use of, for example, hot phosphoric acid. Hereinafter, a film formed of the silicon oxide within the trench 34 of the memory-cell formation section is referred to as an element-isolating film 38a and a film formed of the silicon oxide within the trench 35 of the peripheral-circuit formation section is referred to as an element-isolating film 38b.

Figure 6G:
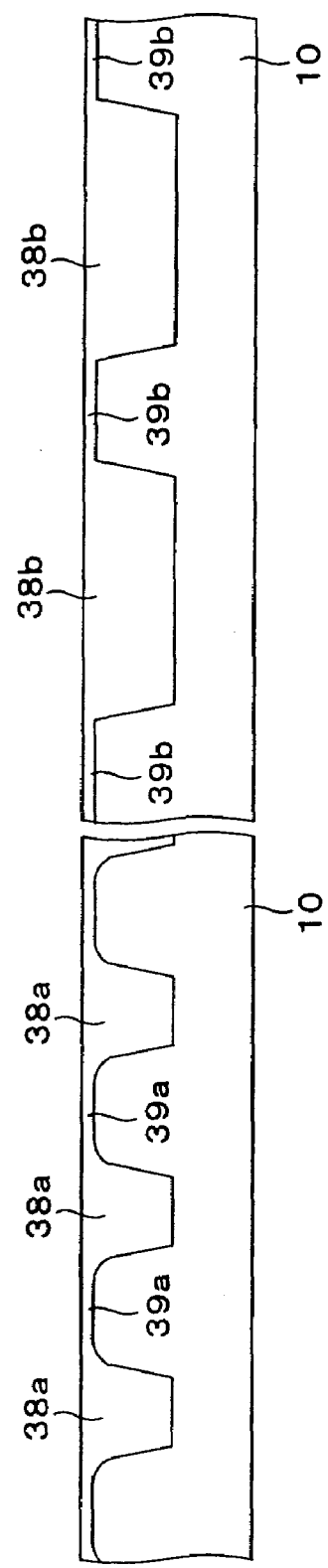

Next, the surface of the substrate 10 is exposed by etching the pad oxide film 32. At this time the element-isolating films 38a, 38b are also etched, resulting in a decrease in film thickness. After that, by performing the thermal oxidation of the surface of the semiconductor substrate 10 exposed by the etching of the pad oxide film 32, as shown in FIG. 6G, a tunnel oxide film 39a is formed in the memory-cell formation section and a gate oxide film 39b is formed in the peripheral-circuit formation section. The film thicknesses of these tunnel oxide film 39a and gate oxide film 39b are set in accordance with the respective required specifications.

Subsequently, in the same manner as in the first embodiment, a floating gate, an intermediate insulating film and a control gate are formed in the memory-cell formation section, a gate electrode is formed in the peripheral-circuit formation section, and furthermore an interlayer-insulating film, a bit line and other interconnections are formed (refer to FIG. 3I). The flash memory is completed in this manner.

In this embodiment, as shown in FIG. 6B, by controlling the etching conditions for the formation of the trench 34, the width of the trench 34 is made narrower than the width of the opening of the resist film 33. For this reason, when the inner surface of the trench 34 is oxidized, the oxidation of the top edge portion 34 is promoted, with the result that, as shown in FIG. 6D, the curvature of the corner of the semiconductor substrate 19 around the trench 34 increases. On the other hand, in the peripheral-circuit formation section, the trench 35 is formed with the width of the opening of the resist film and, therefore, the oxidizing agent (oxygen) volume supplied to the top edge portion of the trench 35 is small, with the result that, as shown in FIG. 6D, the curvature of the corner of the semiconductor substrate 10 on the side of the trench 35 decreases. Because of this, also in this embodiment, the same effect as with the first embodiment can be obtained.

Furthermore, in this embodiment, the film thickness of the element-isolating film 38a of the memory-cell formation section and the film thickness of the element-isolating film 38b of the peripheral-circuit formation section can be individually set as required.

(Fourth Embodiment)

FIGS. 7A to 7I are sectional views showing a fabrication method of a semiconductor device (a flash memory) in a fourth embodiment of the present invention in the order of steps. In these FIGS. 7A to 7I, the section of a memory-cell formation section is shown in the left-hand part of each view and the section of a peripheral-circuit formation section is shown in the right-hand part.

Figure 7A:
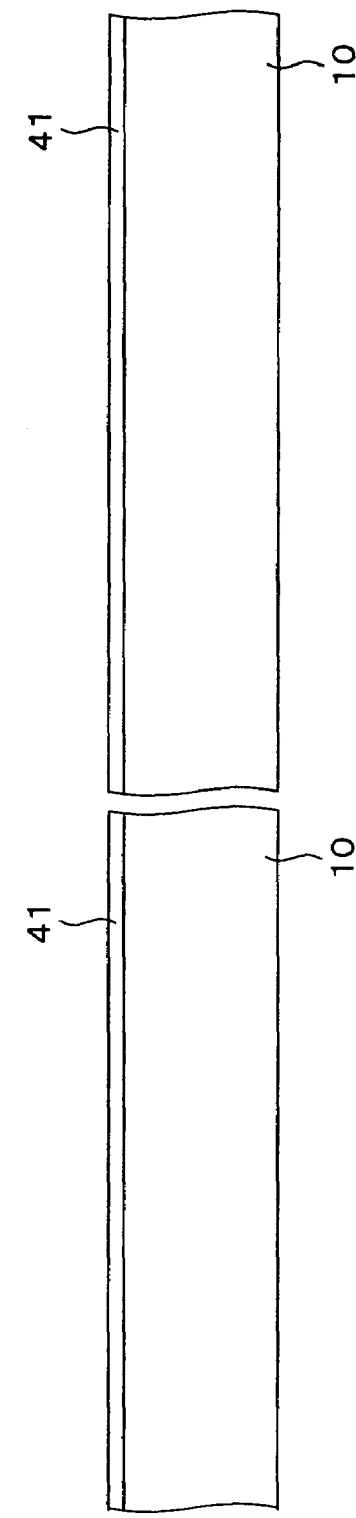
Figure 7B:
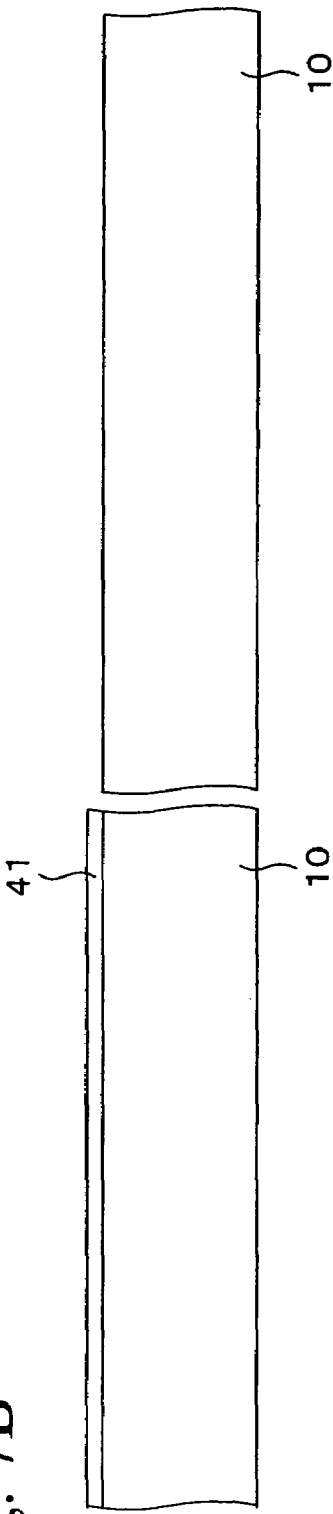

First, as shown in FIG. 7A, a pad oxide film 41 is formed on a semiconductor substrate 10 by, for example, the thermal oxidation process. The memory-cell formation section is covered with a resist film (not shown) and, as shown in FIG. 7B, the pad oxide film 41 of the peripheral-circuit formation section is removed.

Next, as shown in FIG. 7C, by performing again the thermal oxidation of the surface of the semiconductor substrate 10, a pad oxide film 42a is formed in the memory-cell formation section and a pad oxide film 42b is formed in the peripheral-circuit formation section. Incidentally, an oxynitrided film (SiON) may be formed in place of the pad oxide films 42a, 42b.

Next, as shown in FIG. 7D, a polycrystalline silicon film 43 (or an amorphous silicon film) in which phosphorus (P) is doped is formed on the pad oxide films 42a, 42b by the CVD process.

Next, as shown in FIG. 7E, a silicon nitride film 44 is formed on the polycrystalline silicon film 43 by the CVD process. A film of laminated structure of a silicon nitride layer and a silicon oxide film may be formed in place of the silicon nitride film 44.

Next, by etching the silicon nitride film 44 by the photolithography process, the silicon nitride film 44 in the element-isolating region is removed and the silicon nitride film 44 is left only in the element-isolating region. And by etching the polycrystalline silicon film 43 and pad oxide films 42a, 42b by use of the remaining silicon nitride film 44 as a mask and by further etching the semiconductor substrate 10, shallow trenches 45a, 45b are formed respectively in the memory-cell formation section and peripheral-circuit formation section as shown in FIG. 7F.

Figure 7G:
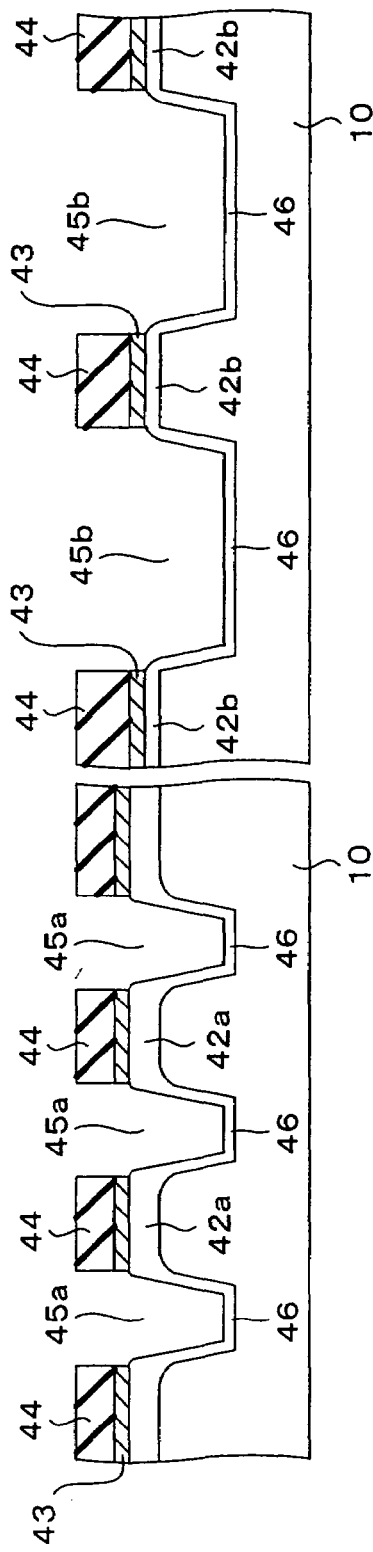

Next, by performing heat treatment in an atmosphere, for example, at a temperature of 850 to 1100□ Ž and at an oxygen concentration of 10%, a silicon oxide film 46 having a thickness of equal or more than 5 nm is formed on the inner surfaces of the trenches 45a, 45b as shown in FIG. 7G.

Since at this time the pad oxide film 42a is formed thick in the top edge portion of the trench 45a of the memory-cell formation section, a relatively large volume of oxidizing agent (oxygen) is supplied to the substrate surface around the trench 45a through the pad oxide film 42a. As a result of this, the corner of the semiconductor substrate 10 around the trench 45a assumes a rounded shape as shown in FIG. 7G.

Figure 7H:
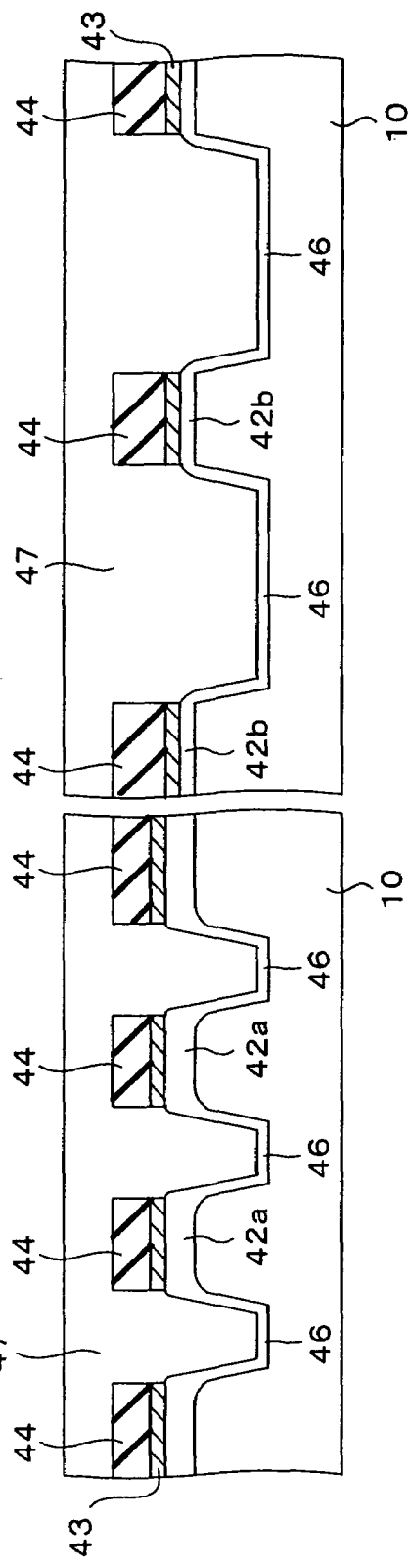

Next, as shown in FIG. 7H, a silicon oxide film 47 is formed by depositing silicon oxide on the whole top surface of the semiconductor substrate 10 by the high-density plasma CVD process and the trenches 45a, 45b are embedded with the silicon oxide. After that, the silicon oxide film 47 and silicon nitride film 44 are polished by, for example, the CMP process, thereby making the surfaces of these films flat. In this step, however, it is necessary only that the silicon oxide within each of the trenches 45a, 45b be mutually isolated, and the polishing is completed before the silicon nitride film 44 is completely removed.

Figure 7I:
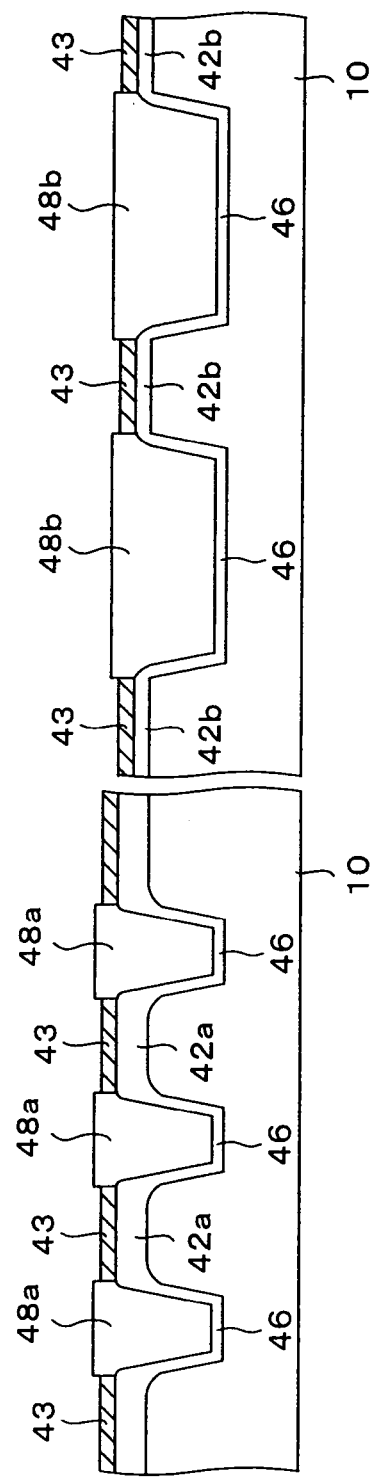
Figure 8A:
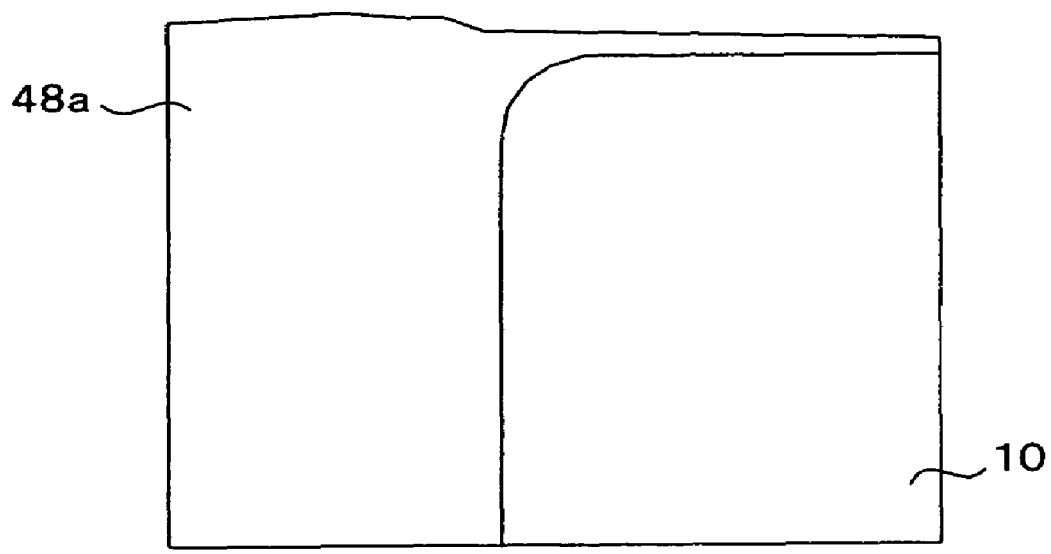
FIG. 8A is an enlarged view of the shape of a top edge portion of an element-isolating film in a memory-cell formation section of the semiconductor device in the fourth embodiment.
Figure 8B:
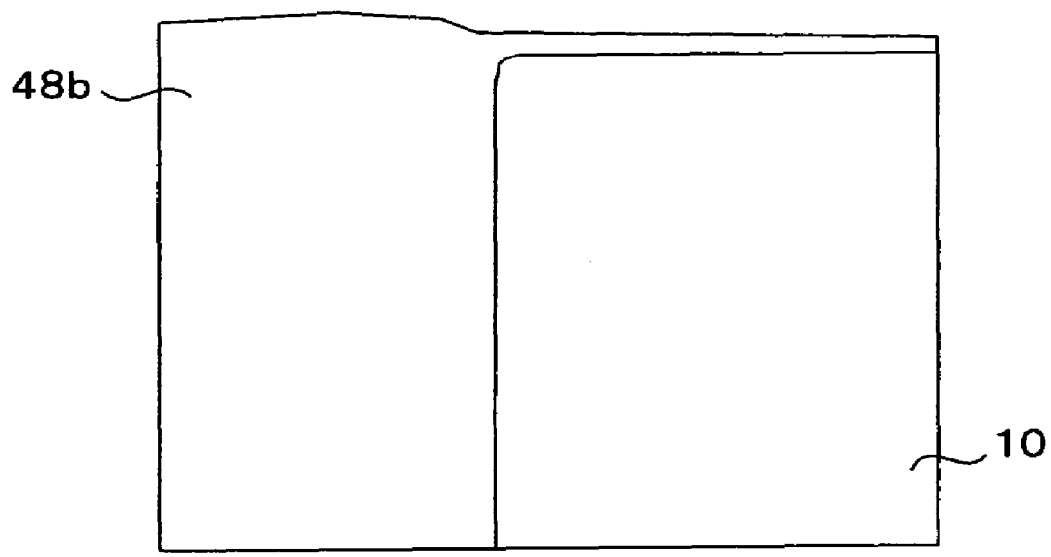
FIG. 8B is an enlarged view of the shape of a top edge portion of an element-isolating film in a peripheral-circuit formation section.

Next, as shown in FIG. 7I, the silicon nitride film 44 is removed by use of, for example, hot phosphoric acid. Hereinafter, a film formed of the silicon oxide within the trench 45a of the memory-cell formation section is referred to as an element-isolating film 48a and a film formed of the silicon oxide within the trench 45b of the peripheral-circuit formation section is referred to as an element-isolating film 48b. In FIG. 8A is shown an enlarged view of the top edge portion of the element-isolating film 48a. In FIG. 8B is shown an enlarged view of the top edge portion of the element-isolating film 48b.

Subsequently, by patterning the polycrystalline silicon film 43 to a prescribed shape, a floating gate is formed in the memory-cell formation section and a gate electrode is formed in the peripheral-circuit formation section. As required, patterning may be performed after increasing the film thickness by further depositing polycrystalline silicon on the polycrystalline silicon film 43.

Subsequently, in the same manner as in the first embodiment, after an intermediate insulating film and a floating gate are formed in the memory-cell formation section, an interlayer-insulating film is formed and a bit line and other interconnections are formed (refer to FIG. 3I). The flash memory is completed in this manner.

Also in this embodiment, the same effect as with the first embodiment can be obtained. Furthermore, since in this embodiment the silicon nitride film 44 is formed after the formation of the polycrystalline silicon film 43 on the pad oxide films 42a, 42b, it is possible to prevent the pad oxide films 42a, 42b from being damaged during the etching of the silicon nitride film 44. As a result of this, the pad oxide films 42a, 42b can be used as a tunnel oxide film or gate oxide film, simplifying the fabrication process. Furthermore, since in this embodiment the polycrystalline silicon film 43 is used as a floating gate or a gate electrode of the peripheral circuit, it is possible to further simplify the fabrication process.

Moreover, unlike the first to third embodiments, this embodiment has no step of etching the element-isolating films 48a, 48b (the step of removing pad oxide films) and, therefore, depressions will not occur in the element-isolating films 48a, 48b. As a result of this, this embodiment provides the advantage that humps will not occur in the transistor characteristics, thereby ensuring good transistor characteristics.

(Fifth Embodiment)

FIGS. 9A to 9H are sectional views showing a fabrication method of a semiconductor device (a flash memory) in a fifth embodiment of the present invention in the order of steps. In these FIGS. 9A to 9H, the section of a memory-cell formation section is shown in the left-hand part of each view and the section of a peripheral-circuit formation section is shown in the right-hand part.

First, as shown in FIG. 9A, a pad oxide film 51 is formed on a semiconductor substrate 10 by, for example, the thermal oxidation process, and a silicon nitride film 52 is formed on the pad oxide film 51 by the CVD process. A film of laminated structure of a silicon oxide layer and a silicon nitride layer may be formed in place of the silicon nitride film 52.

Next, as shown in FIG. 9B, a resist film 53 having an opening in a part corresponding to the element-isolating region of the memory-cell formation section is formed on the silicon nitride film 52. And after the sequential etching of the silicon nitride film 52 and pad oxide film 51 by use of this resist film 53 as a mask and a shallow trench 54 is formed by further etching the semiconductor substrate 10. After that, the resist film 53 is removed.

Next, heat treatment is performed in a hydrogen atmosphere at about 800□ Ž. As a result of this, the top edge portion of the trench 54 shrinks and a gap is formed between the semiconductor substrate 10 of the top edge portion of the trench 54 and the pad oxide film 51 as shown in FIG. 9C. Incidentally, it is desirable to use hydrogen by diluting it with a gas such as Ar (argon), $N_2$ (nitrogen) and the like.

Next, a resist film (not shown) which has an opening in a part corresponding to the element-isolating region of the peripheral-circuit formation section is formed. And the resist film is removed after the etching of the silicon nitride film 52 by use of this resist film as a mask. After that, by etching the pad oxide film 51 of the peripheral-circuit formation section and semiconductor substrate 10 by use of the silicon nitride film 52 as a mask, a shallow trench 55 is formed as shown in FIG. 9D.

Figure 9E:
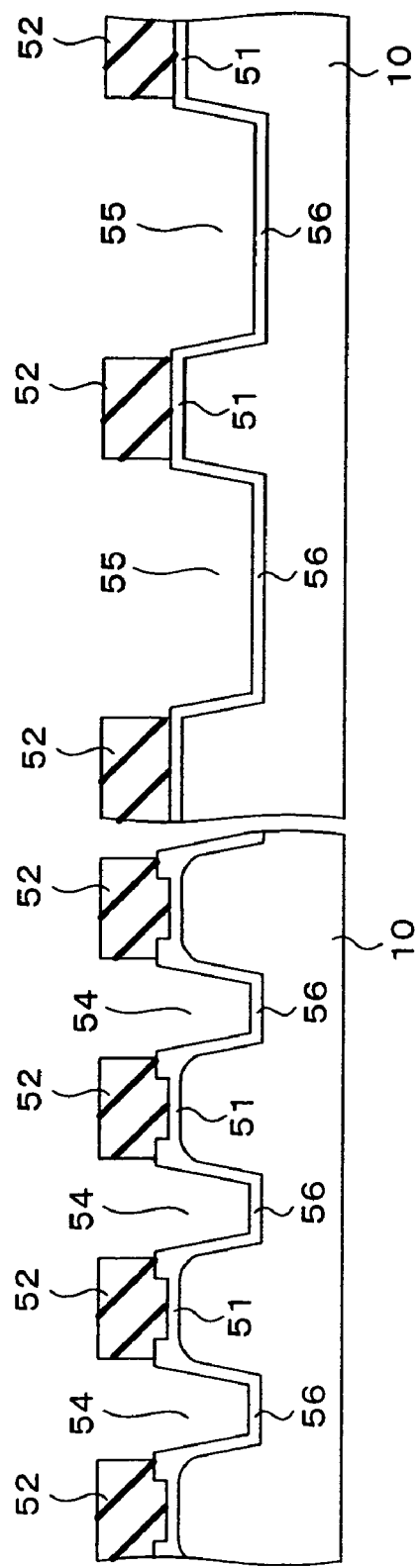

Next, by performing heat treatment in an atmosphere, for example, at a temperature of 850 to 1100□ Ž and at an oxygen concentration of 10%, a silicon oxide film 56 having a thickness of equal or more than 5 nm is formed on the inner surfaces of the trenches 54, 55 as shown in FIG. 9E.

Since at this time in this embodiment, the semiconductor substrate 10 is exposed to the top edge portion of the trench 54, a thick oxide film (a bird's beak) is formed as shown in FIG. 9E and, at the same time, the corner of the semiconductor substrate 10 around the trench 54 assumes a rounded shape.

Figure 9F:
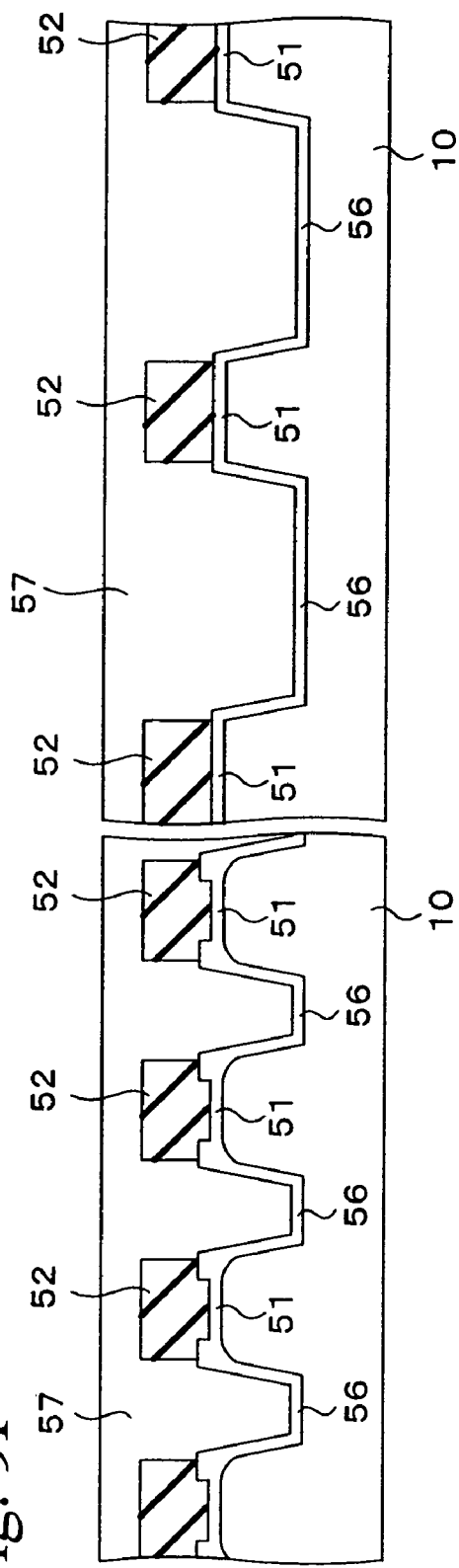

Next, as shown in FIG. 9F, a silicon oxide film 57 is formed by depositing silicon oxide on the whole top surface of the semiconductor substrate 10 by the high-density plasma CVD process and the trenches 54, 55 are embedded with the silicon oxide. After that, the silicon oxide film 57 and silicon nitride film 52 are polished by, for example, the CMP process, thereby making the surfaces of these films flat. In this step, it is necessary only that the silicon oxide within each of the trenches 54, 55 be mutually isolated, and the polishing is completed before the silicon nitride film 52 is completely removed.

Figure 9G:
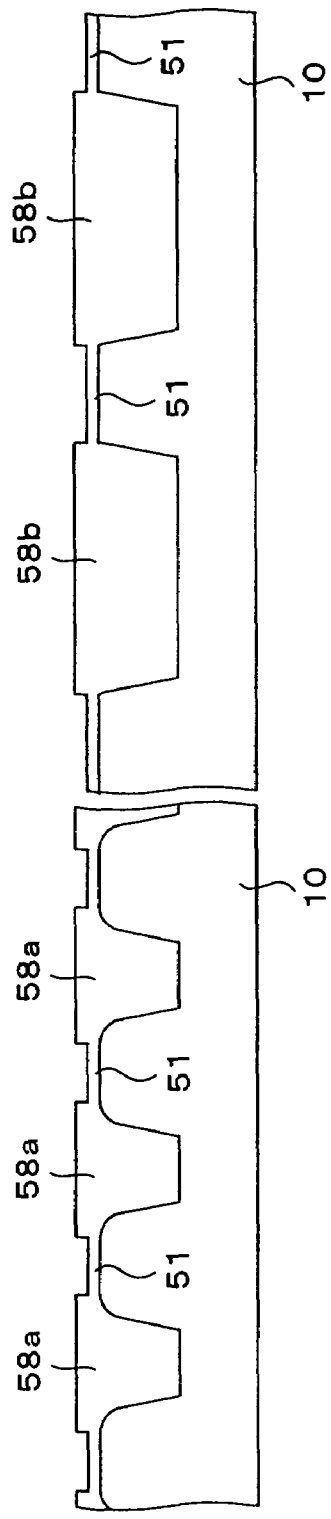

Next, as shown in FIG. 9G, the silicon nitride film 52 is removed by wet etching by use of, for example, hot phosphoric acid. Hereinafter, a film formed of the silicon oxide within the trench 54 of the memory-cell formation section is referred to as an element-isolating film 58a and a film formed of the silicon oxide within the trench 55 of the peripheral-circuit formation section is referred to as an element-isolating film 58b.

Figure 9H:
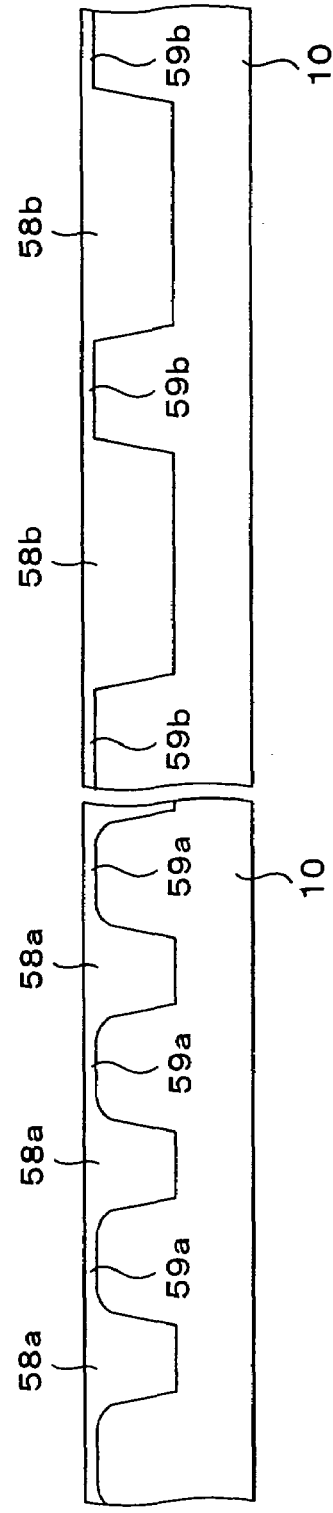

Next, the surface of the substrate 10 is exposed by etching the pad oxide film 51. At this time the element-isolating films 58a, 58b are also etched, resulting in a decrease in film thickness. After that, by performing the thermal oxidation of the surface of the semiconductor substrate 10 exposed by the etching of the pad oxide film 51, as shown in FIG. 9H, a tunnel oxide film 59a is formed in the memory-cell formation section and a gate oxide film 59b is formed in the peripheral-circuit formation section.

Subsequently, in the same manner as in the first embodiment, a floating gate, an intermediate insulating film and a control gate are formed in the memory-cell formation section, a gate electrode is formed in the peripheral-circuit formation section, and furthermore an interlayer-insulating film, a bit line and other interconnections are formed (refer to FIG. 3I). The flash memory is completed in this manner.

Also in this embodiment, the curvature of the interface between the top edge portion of the element-isolating film 58a and the semiconductor substrate 10 increases in the memory-cell formation section, and the curvature of the interface between the element-isolating film 58b and the semiconductor substrate 10 decreases in the peripheral-circuit formation section. Therefore, also in this embodiment, the same effect as with the first embodiment can be obtained.

(Sixth Embodiment)

FIGS. 10A to 10H are sectional views showing a fabrication method of a semiconductor device (a flash memory) in a sixth embodiment of the present invention in the order of steps. In these FIGS. 10A to 10H, the section of a memory-cell formation section is shown in the left-hand part of each view and the section of a peripheral-circuit formation section is shown in the right-hand part.

First, as shown in FIG. 10A, a pad oxide film 61 is formed on a semiconductor substrate 10 by, for example, the thermal oxidation process, and a silicon nitride film 62 is formed on the pad oxide film 61 by the CVD process.

Next, as shown in FIG. 10B, after the patterning of the silicon nitride film 62 in the memory-cell formation section by the photolithography process, a shallow trench 63 is formed by further etching the pad oxide film 61 and the semiconductor substrate 10.

Next, as shown in FIG. 10C, by performing heat treatment in an atmosphere, for example, at a temperature of 850 to 1100□ Ž and at an oxygen concentration of 10%, a silicon oxide film 64 having a thickness of equal or more than 5 nm is formed on the inner surface of the trench 63.

Next, as shown in FIG. 10D, after the patterning of the silicon nitride film 62 in the peripheral-circuit formation section by the photolithography process, a shallow trench 65 is formed by further etching the pad oxide film 61 and the semiconductor substrate 10.

Figure 10E:
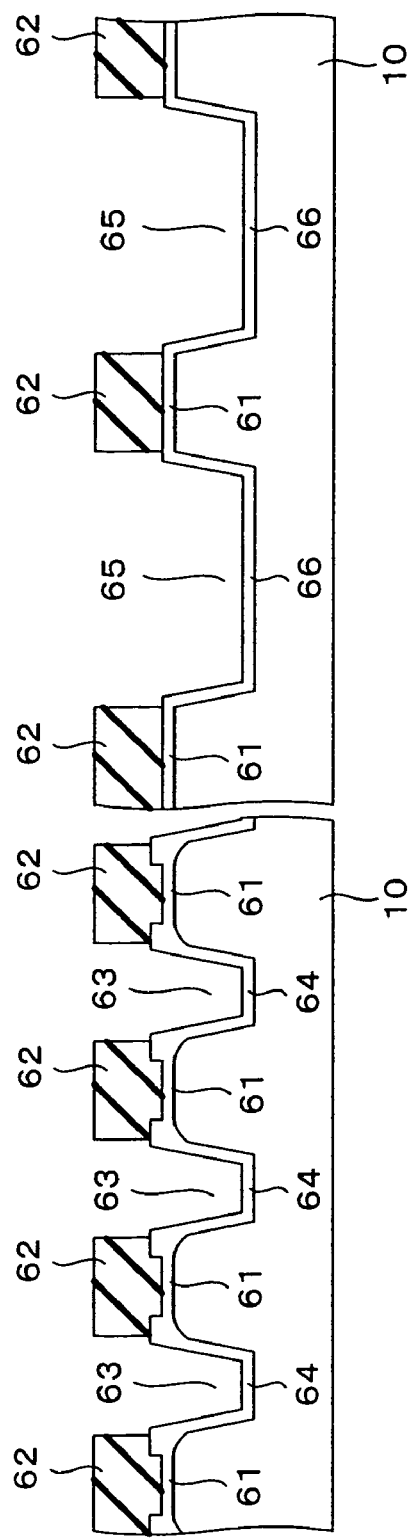

Next, as shown in FIG. 10E, by performing heat treatment in an atmosphere, for example, at a temperature of 850 to 1100□ Ž and at an oxygen concentration of 10%, a silicon oxide film 66 having a thickness of equal or more than 5 nm is formed on the inner surface of the trenches 65.

Since at this time the top edge portion of the trench 63 of the memory cell region has already been oxidized and assumed a rounded shape during the formation of the silicon oxide film 64, the supplied oxygen volume is relatively large and an oxide film having a large thickness (a bird's beak) is formed. At the same time, the curvature of the corner of the semiconductor substrate 10 around the trench 63 increases.

Figure 10F:
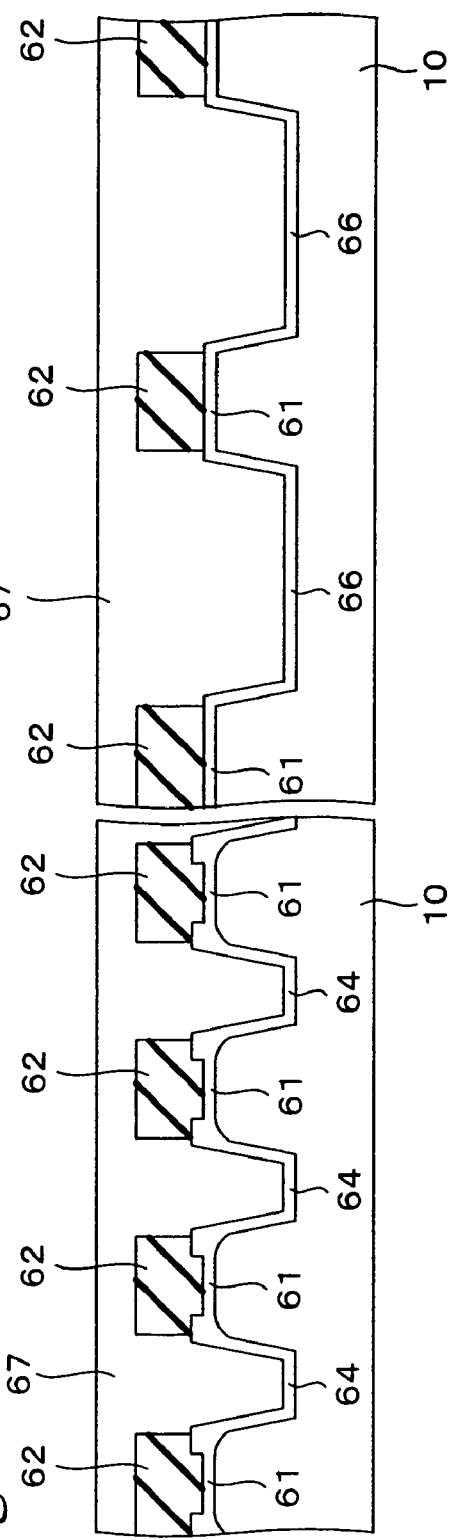

Next, as shown in FIG. 10F, a silicon oxide film 67 is formed by depositing silicon oxide on the whole top surface of the semiconductor substrate 10 by the high-density plasma CVD process and the trenches 63, 65 are embedded with the silicon oxide. After that, the silicon oxide film 67 and silicon nitride film 62 are polished by, for example, the CMP process, thereby making the surfaces of these films flat. In this step, it is necessary only that the silicon oxide within each of the trenches 63, 65 be mutually isolated, and the polishing is completed before the silicon nitride film 62 is completely removed.

Next, as shown in FIG. 10G, the silicon nitride film 62 is removed by wet etching by use of, for example, hot phosphoric acid. Hereinafter, a film formed of the silicon oxide within the trench 63 of the memory-cell formation section is referred to as an element-isolating film 68a and a film formed of the silicon oxide within the trench 65 of the peripheral-circuit formation section is referred to as an element-isolating film 68b.

Next, the surface of the substrate 10 is exposed by etching the pad oxide film 61. At this time the element-isolating films 68a, 68b are also etched, resulting in a decrease in film thickness. After that, by performing the thermal oxidation of the surface of the semiconductor substrate 10 exposed by the etching of the pad oxide film 61, as shown in FIG. 10H, a tunnel oxide film 69a is formed in the memory-cell formation section and a gate oxide film 69b is formed in the peripheral-circuit formation section.

Subsequently, in the same manner as in the first embodiment, a floating gate, an intermediate insulating film and a control gate are formed in the memory-cell formation section, a gate electrode is formed in the peripheral-circuit formation section, and furthermore an interlayer-insulating film, a bit line and other interconnections are formed (refer to FIG. 3I). The flash memory is completed in this manner.

In this embodiment, the curvature of the corner of the semiconductor substrate 10 around the trench 63 is increased by performing twice the thermal oxidation of the wall surface of the trench 63 in the memory-cell formation section. As a result of this, the same effect as with the first embodiment can be obtained.

In this embodiment, after the formation of the silicon oxide film 64 on the inner surface of the trench 63, this silicon oxide film 64 may be removed. Because of this, when the silicon oxide film 67 is formed, the filling of the trench 64 with silicon oxide becomes easy and, at the same time, it becomes possible to further increase the curvature of the top edge portion of the trench 64 in forming the silicon oxide film 66.

Incidentally, the above first to sixth embodiments are described in the case where the present invention is applied to the fabrication method of a flash memory. However, the scope of application of the invention is not limited by these embodiments to a flash memory or a method for manufacturing the flash memory. The invention can be applied to various types of semiconductor devices in which a transistor operating at a high voltage and a transistor operating at a low voltage are formed in the same semiconductor substrate and a method for fabricating such semiconductor devices.

What is claimed is:

1. A semiconductor device, comprising:
   a plurality of first elements formed in a first region of a semiconductor substrate;
   a first trench formed between said first elements in said first region;
   a first silicon oxide film formed on the side and bottom portion of said first trench;
   a first element-isolating film including an insulting material which fills said first trench;
   a plurality of second elements which are formed in a second region of said semiconductor substrate and to which a voltage higher than that of said first element is supplied;
   a second trench formed between said second elements in said second region;
   a second silicon oxide film formed on the side and bottom portion of said second trench; and
   a second element-isolating film including an insulating material which fills said second trench,
   wherein a curvature of a corner of said semiconductor substrate around said second trench is larger than a curvature of a corner of said semiconductor substrate around said first trench;
   wherein a second oxide film formed in said second elements is thicker than a first oxide film formed in said first element;
   wherein said second silicon oxide film formed on the side and bottom portion of said second trench is as thick as said first silicon oxide film formed on the side and bottom portion of said first trench; and
   wherein said second element is a memory cell of a nonvolatile semiconductor memory.

2. The semiconductor device according to claim 1, wherein said first element is a MOS transistor.

* * * * *